United States Patent [19]
van der Have

[11] Patent Number: 5,128,737
[45] Date of Patent: Jul. 7, 1992

[54] SEMICONDUCTOR INTEGRATED CIRCUIT FABRICATION YIELD IMPROVEMENTS

[75] Inventor: Leonard A. van der Have, Ames, Iowa

[73] Assignee: Silicon Dynamics, Inc., Ames, Iowa

[21] Appl. No.: 487,768

[22] Filed: Mar. 2, 1990

[51] Int. Cl.$^5$ .............................................. H01L 27/02
[52] U.S. Cl. ............................................ 357/40; 357/71
[58] Field of Search .................... 357/40, 71, 23.7; 365/96, 200; 371/22.3, 25.1

[56] References Cited

U.S. PATENT DOCUMENTS

| | | | |
|---|---|---|---|
| 4,329,685 | 5/1982 | Mahon et al. | 357/96 X |
| 4,868,789 | 9/1989 | MacDonald | 365/219 X |
| 4,920,403 | 4/1990 | Chow et al. | 357/71 O |
| 5,008,723 | 4/1991 | van der Have | 357/23.7 |

FOREIGN PATENT DOCUMENTS

WO89/12320 12/1989 United Kingdom .

OTHER PUBLICATIONS

"Semiconductor Technology Handbook", Technology Associates Inc., pp. 15—3-15—7 (1982).
"ULSI Technology", S. M. Sze, McGraw Hill, pp. 607-612 (1983).

Primary Examiner—Rolf Hille
Assistant Examiner—Roy Potter
Attorney, Agent, or Firm—Hamilton, Brook, Smith & Reynolds

[57] ABSTRACT

Microelectronic integrated circuit fabrication yield is improved through architecture which provides for the search and identification and avoidance of electronic malfunctions in wafer sub-circuits, each of which perform an identical function, such as memory. A processor contained within each wafer performs these search, identification and repair functions via communication pathways (busses) formed on the wafer. The processor records the location and type of electronic defects within each sub-circuit and reconfigures the balance of the circuitry included within the overall circuit to provide for a useful overall electronic circuit function using the sub-circuit building blocks.

5 Claims, 18 Drawing Sheets

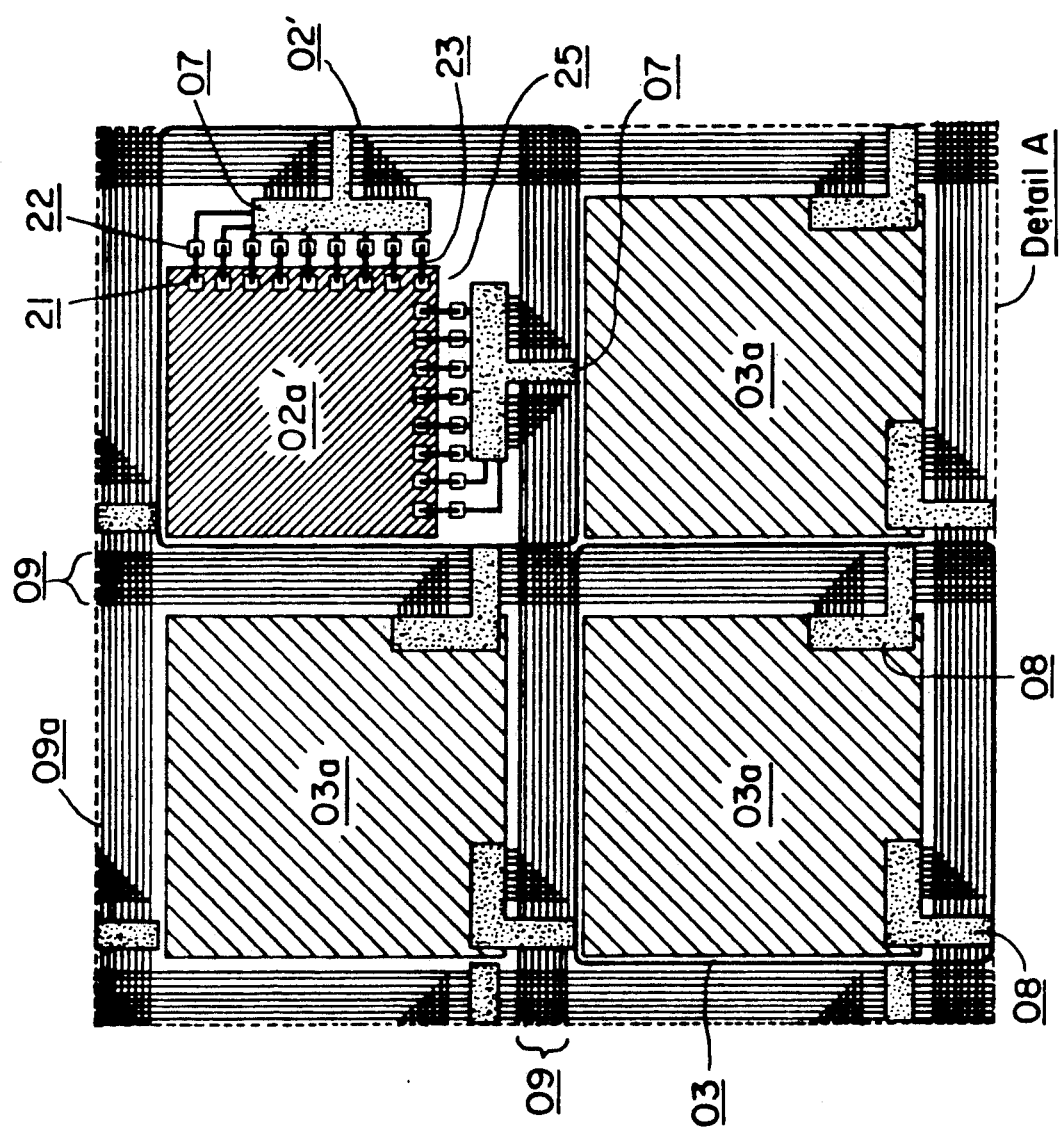

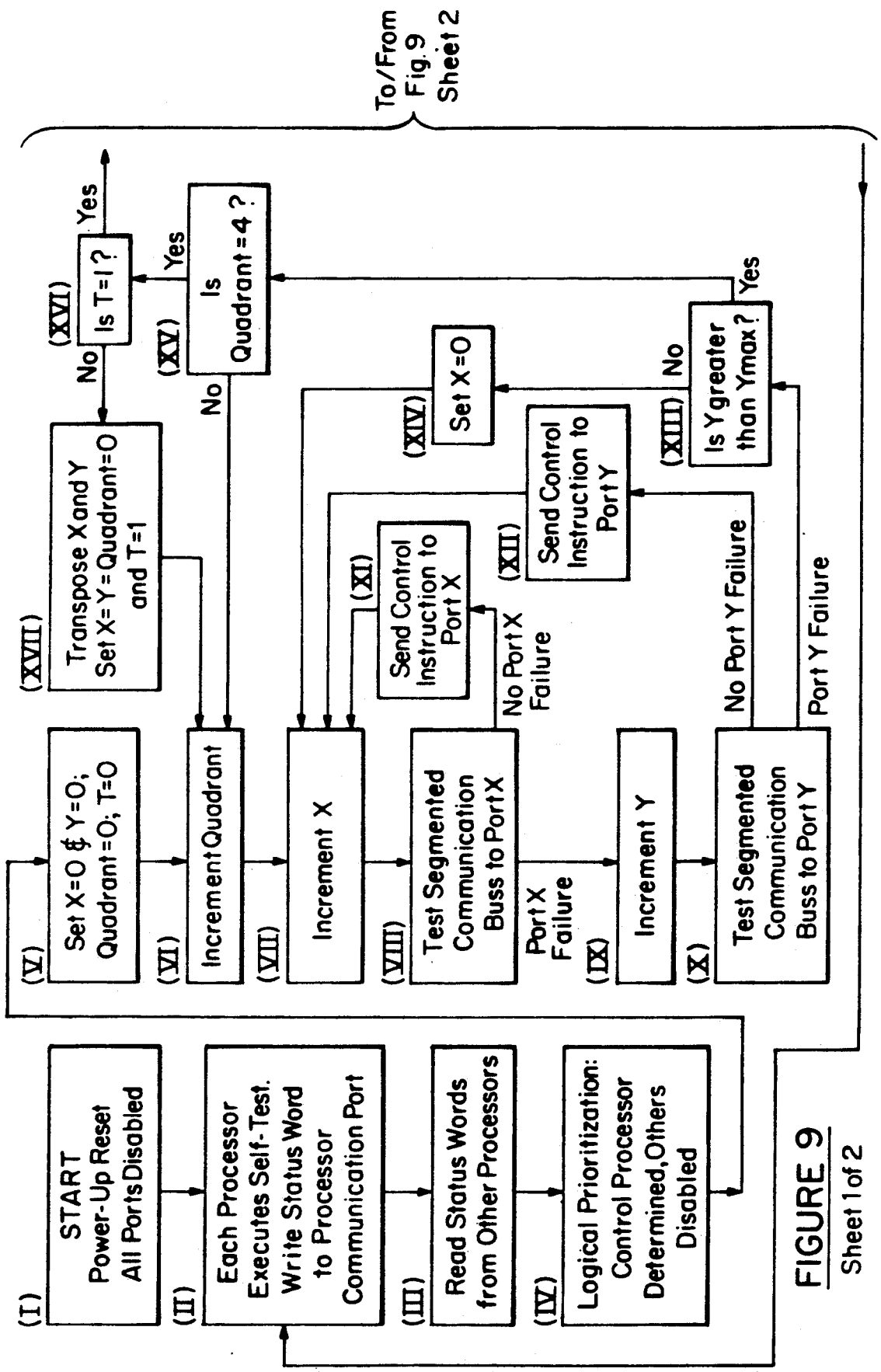

SEMICONDUCTOR INTEGRATED CIRCUIT FABRICATION YIELD IMPROVEMENTS

FIELD OF THE INVENTION

This invention relates to a method and apparatus for fabricating microelectronic circuits in wafer form.

BACKGROUND OF THE INVENTION

The prior art for fabrication of microelectronics is dominated by the utility of fabrication facilities that process semiconductor base wafer material which is shaped in a thin and nearly circular wafer format. This format provides for an economy of scale in amortizing the fixed costs for fabrication of each wafer over the plurality of microelectronic circuits, each of which are identically patterned in many places on each wafer. Following the wafer fabrication process, each of the patterned circuits are electronically tested on the wafer using wafer probe test equipment which serves to identify which of these individual patterned circuits functions in a useful manner. Those patterned circuits which are not electronically functioning or useful are typically marked with a small but visible ink dot. The wafer is then diced or sawed so as to separate each of the patterned circuits, after which those ink dots are used to identify which of the individual circuit die are non-functional and require removal from further microelectronic manufacturing steps. Those individual circuit die with no ink dot are therefore known to be good through wafer fabrication, and are further processed into component packaging and ultimately into electronic equipment and systems in common use today.

This method for microelectronic wafer fabrication is typically employed because wafer fabrication is characterized by a random statistical rate of occurrence of defects in the physical or electrical formation of microelectronic structures on the wafer. Typical causes for defects are particle contamination of the wafer surface as it proceeds through each processing step, contamination of the photolithography equipment and tooling used to pattern each wafer, and physical stresses induced on each wafer as a function of the particular fabrication technology employed.

Conventional electronic design practice does not provide for electronic circuits which can function after they have been electronically modified by physical defects that occur in wafer fabrication. In addition, it is not possible to entirely eliminate all of these sources of wafer defects while in the wafer fabrication phase or to know where these defects are located on the wafer prior to an electrical test of the wafer. Therefore, the microelectronic manufacturer has used in the prior art one of four methods for further testing and processing of wafers after their fabrication:

(1) Wafer Probe: In this procedure, an electrical test is performed of each patterned circuit on the wafer prior to dicing or sawing. This is done by using wafer probe equipment which is typically automated to make electrically conductive probe contacts of the test system onto conductive patterns in each circuit, followed by the test system performing a variety of electrical tests which are then interpreted as to whether or not the circuit pattern under test is functional. Should the circuit under test fail an electrical test criteria, the test equipment then places a small ink dot on top of the circuit under test. After the wafer probe tests are completed, some portion of the patterned circuits (typically between 10 and 90 percent) are known to be electrically defective due to the random statistical occurrence of fabrication defects. These circuits are then removed from further processing once the wafer is diced or sawed. This is the most common practice, as the cost of performing this wafer probe electrical testing (to identify and remove defective circuits from further processing at this point) is typically less than the costs which result from performing the remaining manufacturing steps on the defective circuits as well. Regarding the present-day component industry, a cost savings is typically realized when wafer probe testing identifies greater than 10 percent of the circuits as defective, the yield through the remainder of the manufacturing steps is typically greater than 90 percent, and the costs for producing each monolithic circuit and the remaining manufacturing steps (e.g., assembly and testing of the circuit in microelectronic packaging) are comparable.

(2) No Wafer Probe: In cases where the patterned circuits are much smaller in their physical area when compared to the average density for the formation of defects from wafer fabrication, then the statistical yield will typically become higher than the yield associated with the immediate manufacturing steps following wafer fabrication. These immediate manufacturing steps are typically the microelectronic packaging of each circuit die, followed by an electrical test of the completed component to remove the non-functional circuits. An example of this case is the fabrication of simple, single transistors as each pattern on the wafer, where the statistical yield is typically on the order of 90 percent. In this case, it is less expensive not to perform a wafer probe test and then to discard the 10 percent additional microelectronic packages which could have otherwise been saved in method (1) above, after a final component test is performed.

(3) Redundant Programming: In cases where the patterned circuits are very large in their physical area compared to the density of defects occurring from wafer fabrication, the statistical electrical test yield becomes low (under 10%). Regardless of the methods for wafer probe and final manufacturing involving these circuits, the amortized costs for manufacturing these large monolithic circuits increases nearly exponentially as a function of increasing circuit pattern (or die) size. Some manufacturers have elected to incorporate wafer probe schemes in which the individual circuits are patterned to include redundant regions which are then identified by the test system as being electrically functional or non-functional. The test system then determines if the nature of the non-functional circuits permits the re-configuration of the redundant regions to return the circuit under test to complete functionality. If this is possible, then the test system, while still in probe contact with the circuit under test on the wafer, then "programs" the useful circuits to function in the presence of the defective locations. This programming, for example, may involve the electrical "blowing" of a microelectronic resistive fuse-link film, made as part of the circuit under test, which acts to re-configure each circuit to operate properly following this operation. This scheme is typically employed to manufacture high-capacity (256K bits and larger) static random access memory components.

(4) Custom Wafer Patterning: Similar to the redundant programming scheme of paragraph (3) above, a few manufacturers perform all but the final wafer fabrication steps where the last interconnect films are not patterned. In these cases, some of the interconnect films are completed so as to enable wafer probe of the redundant sections of a very large circuit. The wafer probe test system determines which sections are functional and records this information for that wafer in an information data base. This data base becomes a record of where the electrical defects are located on each wafer. This data base is then processed by a computer to output a new data file which is used by an electron-beam photo lithography system for the purpose of custom patterning of each wafer with final layer(s) of interconnect film to complete wafer fabrication. Given that the statistical yield through the wafer fabrication of the final interconnect layer(s) is high, then each circuit is functional with high yield as well. This method is employed for very large circuits requiring a variety of different functions, and for which the high cost for custom patterning of each wafer can be justified.

(5) In-Circuit Testing: Some manufacturers of very large scale integrated (VLSI) components such as microprocessors and gate arrays have employed small test circuits, integrated as part of these larger and more complex circuits which perform in-circuit testing of the circuit. This method is employed as a result of a trend in higher complexities in integrated circuit fabrication which result in circuits which cannot be fully tested by an external test system, made to be brought into probe contact with the die or with the available electrical conductive pins of the package containing the circuit die. This result follows from the inability of an external test system to have adequate coverage of all of the possible electrical states of these complex VLSI circuits, given the number of external connections available with the VLSI circuit. Therefore, these manufacturers include in these VLSI circuits a test circuit which has the additional connections required to perform adequate testing of the states of a VLSI circuit without requiring additional external connections for this purpose. This test circuit then provides electrical information, through as few external connections as possible, which is utilized in conjunction with an external test system to determine overall functionality of the VLSI circuit. This method is typically employed for circuits having greater than 10,000 transistors, and is often used in conjunction with any of the wafer probe methods described above in paragraphs (1), (3), and (4).

In summary, manufacturers who produce simple microelectronic circuits (on the order of 1-10 transistors) typically realize circuit yields greater than 90%, often employ no wafer probe and simply discard the defective circuits after all of the die have been assembled and tested in microelectronic packaging. These monolithic circuits are rarely larger than 5 mm$^2$ in their die areas. Manufacturers who do perform wafer probe per paragraph (1) above are producing circuits which yield typically between 10% and 90%, have between approximately 10 and 100,000 transistors per circuit, and which are typically between 2 mm$^2$ and 100 mm$^2$ in area. Manufacturers patterning circuits greater than 100 mm$^2$ in area and over 100,000 transistors often employ one of the methods per paragraphs (3) or (4) above where otherwise the producing yields for these circuits would be less than 10% if using either of the methods per paragraphs (1) or (2) above.

It is clear from the above summary that a relationship exists between circuit pattern size and circuit statistical yield following electrical testing. Several models that predict accurate yield statistics in a wafer fabrication environment have been developed and are understood by those skilled in the art. Each of these models identify a statistical figure of merit for the characteristic density of defects applicable to the particular wafer process technology employed. A parameter for the density of defects, established by special electrical test patterns on representative wafers, quantifies the average number of defects per unit area on the basis that each of these defects is sufficient to cause a fatal electrical failure of the circuit in which it resides.

Yield models such as Murphy & Seeds See "Semiconductor Technology Handbook", Technology Associates Inc., pp. 15-3-15-7 (1982)] or the Gamma Function [See "VLSI Technology", S. M. Sze, McGraw Hill, pp. 607-612 (1983)] have been used to describe the yield statistics for each of the prior art methodologies per paragraphs (1) through (4) above. Each of these models illustrates that increasing the pattern size of the circuit will reduce the electrical test yield, given a constant density of defects for wafer fabrication. More sophisticated models have been demonstrated which identify separate defect density parameters for separate portions of the wafer fabrication process, as well as to accurately predict the yield statistics for very large circuits.

The Murphy & Seeds models have been historically employed to predict accurate electrical test yields for circuits of various physical sizes and complexities, manufactured with various bipolar and MOS wafer fabrication technologies. As the preferred embodiment of this invention pertains to the fabrication of very large circuits based on using any of these prior art fabrication technologies, and in an effort to be representative in the demonstration of the changes in yield which are caused through the use of the present invention, the Murphy & Seeds models will be employed uniformly throughout the description of the preferred embodiment.

SUMMARY OF THE INVENTION

The present invention defines a new concept for increasing wafer fabrication yield through the implementation of a new microelectronic architecture which enables each circuit to perform search and identification of electronic malfunctions within its overall physical area. These malfunctions are caused by one or a plurality of wafer fabrication defects within the physical area of the circuit. This architecture is constructed so that a self-learning algorithm, contained in a processor fabricated within each circuit, enables that processor to re-configure the remainder of the microelectronics fabricated within the overall circuit to provide for a useful electronic function. Computer simulation of this method and apparatus demonstrates a dramatic increase in circuit yield probability, particularly when the circuit is produced to be as large as possible. Implementation of this method obviates the need for automatic test equipment to probe the wafer for the purpose of identifying defective circuits since no added benefit is obtained by such testing. In particular, the method of the invention demonstrates high circuit fabrication yield when applied to very-large-scale processor and memory circuits which are collectively configured according to this method.

The method and associated apparatus of the invention enables fabrication of very large microelectronic circuits up to 30,000 mm$^2$ in physical area and containing approximately 10,000,000,000 transistors on single wafers with electrically functioning yields greater than 90%. These results are based on the present-day availability of wafer fabrication technologies whose circuits can be modified in accordance with this invention. No electrical wafer probe testing or wafer dicing (or sawing) is needed in order to manufacture a useful microelectronic device. This method is a significantly more economical method for the fabrication of large circuits of over 100,000 transistors when compared with the presently known prior art methods.

This invention is a method and associated apparatus for fabrication of microelectronic circuits on a semiconductor wafer, which circuits are modified by the implementation of a new microelectronic architecture which causes an improvement in the statistics defining the yield for electrically functional circuits. Any particular microelectronic process technology can be employed with the only modifications of the fabrication process being the manner by which the required circuits are patterned on the wafer. A plurality of these circuits is patterned on the wafer, or one circuit is patterned to occupy the entire wafer. This invention can be applied to increase the electrical test yield of circuits fabricated with any existing microelectronic process technology as presently understood by those skilled in the art.

The invention, in general, comprises a semiconductor wafer upon which one or many microelectronic circuits according to this invention is fabricated. Each of these circuits is an overall circuit which consists of a plurality of sub-circuits interconnected via a plurality of communication busses, also formed within each overall circuit. It is preferable that a majority of these sub-circuits is identical in physical layout and dedicated to performing the same electronic function or functions, e.g., memory. In this sense, these identical sub-circuits may sometimes be referred to herein as dedicated sub-circuits to differentiate them from other sub-circuits of which there may be at least, two types; a processor sub-circuit and an input/output sub-circuit, as described below. Each of these dedicated sub-circuits has a pair of communication ports associated with it for the purpose of sending or receiving signals between that sub-circuit, using the communication busses, and other sub-circuits. At least one processor sub-circuit is formed within each overall circuit or attached thereto. Each processor sub-circuit also has a pair of communication ports associated with it for the purpose of sending or receiving signals between that sub-circuit, using the communication busses, and other sub-circuits. The communication ports in all sub-circuits extend across a plurality of conductive pathways comprising each of the communication busses. These communication ports have the ability to electrically control, or "segment", each of the plurality of electrical signals on the conductive pathways which electrically interconnect adjacent sub-circuits together. In this manner, the communication busses are segmented into smaller sections, each of which are electrically controlled. The processor sub-circuit electrically tests each segmented communication buss and determines which of these busses are non-functional. Based on that information, the processor sub-circuit controls the operating states of the functional segmented communication busses in order to configure a data path which is electrically contiguous and fully operational to as many of the other sub-circuits as possible. The processor then electrically tests and records the operating condition of the remaining sub-circuits which can communicate with the process via the functional communication busses. The processor then uses this information to control which portions of which other sub-circuits are to be made useful by way of one of a plurality of input/output interfaces also formed within the overall circuit. In this manner, the processor sub-circuit electronically operates to make useful as many of the other sub-circuits as possible, in the presence of electrically defective circuitry also contained within the physical area of the overall circuit, without the use of an external wafer probe or electrical test system to identify and/or program the circuit's initial functionality.

The preferred embodiment of this invention is directed to fabricate a memory, or information storage function, which is the function of a majority of the sub-circuits fabricated within the overall circuit. This embodiment requires the implementation of a new microelectronic processor, memory and I/O port sub-circuits, patterned together as part of each overall circuit on the wafer, which cause this new architecture to be created. The preferred embodiment also employs new communication busses (areas comprising the individual conductive interconnect pathways) and communication ports (small circuit units, incorporated to function as part of each sub-circuit, for sending or receiving signals part of these pathways from or to each sub-circuit). These communications ports collectively function to further improve the overall circuit yield and to provide for faster electronic operation of the overall circuit as a whole.

This new method and apparatus requires that each of the functional processor sub-circuits be constructed so that each is self-starting upon the initial application of electrical voltages to the overall circuit or wafer, such that each processor performs a first-phase self-test algorithm to establish whether or not it is fully operational. If a processor sub-circuit fails any portion of this self test, the processor sub-circuit maintains (with a very high probability) an electrical state where its associated communication ports are not activated. These ports are otherwise used for the subsequent processor-to-memory or processor-to-I/O (input/output) communications if the processor passes this self-test. These communication ports are preferably fabricated to include two sets of identical transmission gate structures in series with each communication port signal output, so that two simultaneous control signals are required to activate any amplifier output. In addition, these ports include a resistor in series with each amplifier input and transmission gate control line which is associated with each communication port signal. By this preferred method of fabrication, no single electronic failure event can cause a communication port to remain in an electrical state which can cause a common electronic failure for communication among all sub-circuits. In addition, these ports occupy a small percentage of the physical area (about 6% in the preferred embodiment) of the overall circuit. As a result, there is a minimal probability (calculated to be much less than 1% by computer simulation for the preferred embodiment) that none of these communication ports will fail into an electrical state which can interrupt overall circuit communication due to wafer fabrication defects. Each of the overall circuits on the wafer (or one overall circuit on the entire wafer) is patterned to include one or, by the preferred embodiment, a plurality of these processor sub-circuits which operate identically as far as execution of this first phase self-test algorithm.

Depending on the physical size of each of these processors and the density of fabrication defects for that wafer, a certain average percentage of these processor sub-circuits will pass their electrical self-test algorithms and proceed to enable their communication ports for communication with other sub-circuits. The processors, along with all of the other sub-circuits contained within each overall wafer circuit, are patterned so that their communication ports are electrically interconnected together through areas identified as communication busses. Each of these processors is patterned in the preferred embodiment so that each is exclusively provided with a photolithically programmed priority sequence code. Each functional processor then proceeds to communicate directly with all of the other processors included within the overall circuit to record which of the other processors are functional within each overall circuit. That processor whose priority sequence code matches the lowest (or optionally, the highest) code recorded for all functional processors, then takes control of the overall circuit and becomes the control processor. In a like manner, all of the other functional processors are either temporarily or permanently disabled at this time, until such a time that the electrical voltages are removed from the circuit or other subsequent software programs, executed by the control processor, re-enables any of these other functional processors to perform a computational operation.

The control processor then proceeds with the execution of a second phase of its start-up algorithm for testing of the communication busses within the overall circuit. This algorithm instructs the control processor to proceed with a sequential, step-by-step testing of the communication busses and communication ports associated with each of the other individual sub-circuits within the overall circuit (which can occupy the entire wafer). The control processor begins this phase by first testing those communication busses and communication ports adjacent to that processor then that processor uses those busses and ports known to be fully functional to communicate new test signals to those busses and ports adjacent to the first functional busses and ports (next farther away from the control processor), and proceeds in this repetitious manner until the processor electronically finds communication busses or ports which do not function Each time a failure is detected by the control processor, the processor has either attempted to communicate beyond the periphery of the overall circuit, or a non-functional communication buss or port has been found within the overall circuit. The processor's algorithm then proceeds with testing of the communication busses and ports which are located orthogonal to a defective one, and it determines that either (a) a buss was already tested to be functional (there is a small memory in each communication port for this purpose), or (b) that the busses orthogonal to the first defective one are also defective. When all busses are defective, the control processor sub-circuit re-starts this second-phase testing a second time, this time transposing the initial directions (with respect to the control processor's location) for buss testing and using already known functional busses from the first pass to test areas that the processor may not have been able to reach within the overall circuit on the first pass. Verification of each communication buss also verifies full functionality of a communication port in an adjacent sub-circuit as well. Each time a buss is found to be functional, the control processor sends a control instruction to the associated port which (a) enables that port to attempt communications with the next buss straight ahead (away from the control processor) to which the port is connected, (b) enables communications between both sub-circuit communication ports contained within the boundaries of each sub-circuit so that the other adjacent and orthogonal buss can be accessed, and (c) the processor provides an address data word which is recorded at that port to provide for the subsequent, contiguous addressing of each sub-circuit by the control processor as required to execute most software routines. When this buss testing is completed, only the fully functional, segmented communication busses are configured to operate, under the control of these instructions conditionally and sequentially stored within each port. These configured communication busses operate in such a manner which is equivalent to the case as though they where electrically fabricated together as one larger set of conductive pathways contiguous throughout the overall circuit. By this method, all defective busses are electrically disabled from operating with any of the functional ones. It is at this point that these busses are fully configured for maximum utility of the sub-circuits comprising the overall circuit. A majority of these sub-circuits (other than the control processor) are memory elements which, by the preferred embodiment, are patterned so as to have the same physical size as the processor circuits. This is desired so that the communication busses, used for sending and receiving electrical signals among the sub-circuits, are patterned to be uniformly straight in each of two orthogonal directions within each overall circuit, and such that these busses utilize minimal physical area within the overall circuit.

Once all of the communication busses are configured for operation by the control processor, it then executes a third phase of its start-up algorithm by testing the interior portions of each sub-circuit connected to the functional busses. The control processor addresses each sub-circuit (at whose communication ports have been recorded sequential address data words) to perform a complete electrical test of each sub-circuit. In the preferred embodiment, these other sub-circuits are either a memory or an input/output (I/O) function, although these other sub-circuits can be fabricated to have such functions as floating-point calculators, graphics presentation processors and redundant co-processors which can be used for parallel processing. The results of the processor's evaluation of the electrical performance of each of the other sub-circuits determines the entries that the processor records, within a random access memory (RAM) located within its boundary, for each address for the next sequential and functional portion of each of the other sub-circuits. These addresses are to be used by the control processor in place of those addresses for portions of other sub-circuits found to be electrically defective. This processor RAM functions as a table which stores the "jump" addresses of good portions of sub-circuits which are substituted by the processor when it attempts to address a bad portion of any sub-circuit which has been previously configured for access through the network of communication busses. This substitution is performed by the operation of the control processor in such a manner that its RAM functions to translate addresses direct from that processor's arithmetic logic unit and control unit (when executing software that requires memory to be all functional from one address value to another; e.g., to have a single contiguous address range) into several non-contiguous address ranges, each of which represents fully functional portions of an overall circuit. These translated addresses are then sent out from the processor sub-circuit to all the other sub-circuits for the purpose of performing read/write operations to memory or I/O ports within the overall circuit. It is with these special considerations in processor operation, together with the start-up configuration of segmented communication busses to electrically operate as one single communication buss, that the overall circuit, having this architecture, is capable of operating to disable the defective portions of itself while remaining capable of executing software of conventional design requiring a single contiguous address range of memory. This architecture also requires that electrical defects are constant over some minimal amount of time such that once this processor algorithm has been completed, the overall circuit will remain in a useful state for some minimal period of time associated with the manner in which it is to be used. This figure of merit has been historically established by industry by virtue of it employing any of the prior art methods cited above for identifying functional circuits, all of which have demonstrated that the operating state of these circuits do remain constant over a minimal period of time, depending on their application. In summary, there are three types of electrical failures which will cause non-use of any portion of a sub-circuit tested by this control processor start-up algorithm: (1) defects exist in both of each set of communication busses and communication ports associated with each sub-circuit, so that the sub-circuit is totally isolated from communication with the control processor, (2) a combination of defects in other sub-circuit locations isolates the sub-circuit from the control processor, or(3) a defect exists within any portion of the remainder of the sub-circuit. In the preferred embodiment, the area patterned for all of the communication busses and the communication ports is much less than the area needed to pattern the remainder of the sub-circuits (e.g. the internal portions of each sub-circuit which comprise the actual processors, memories, and I/O ports, not including the communication ports and busses which are patterned as part of each sub-circuit). Given that the rate of occurrence of defects is uniform across these sub-circuits, it is therefore expected that defects from wafer fabrication will result in a higher statistical yield for each of the communication busses and communication ports than for each of the remainder of the sub-circuits themselves. As a result of this difference in areas, it is expected that most of the electrical failures found within the overall circuit will be associated with failures in the processors, memories, and I/O ports. The preferred embodiment incorporates this favorable difference in areas, although this is not a necessary requirement, to cause an increase in overall circuit yield for alternative embodiments of this invention.

With this difference in fabrication yield among the areas described above, it is practical in very large circuits for the control processor to record all of the electrical data words which address those sub-circuits which can be electrically defective. This method requires special patterning and physical interconnection of the sub-circuits (not done in the prior art). The start-up algorithm, encoded into read-only memory within the boundaries of each processor sub-circuit, is needed to perform adequate electrical verification of the other sub-circuits and the busses connecting the other sub-circuits together. This method obviates the need for an outside test system to be used to probe the wafer as is required by the prior-art methods described above for the fabrication of large circuits. This method also serves to provide for the increase in overall circuit yield as each overall circuit collectively acts to identify where its own electrical defects are located, and then acts to electronically re-configure the redundant sub-circuits and communication ports to avoid use of defective sub-circuits in any subsequent function. This entire process of self-testing and self-configuring is accomplished within a very short period of time (less than one second is typical) after each time the electrical voltages are first applied to the overall circuit, or after a software re-start instruction is given to the control processor.

This method is useful for the fabrication of circuits which are not smaller than 100,000 transistors (as required to fabricate a processor capable of self-testing & self-configuration according to this method) and as high as 10,000,000,000 transistors (on a single 8" diameter wafer), by the preferred embodiment using the highest density wafer fabrication technology being employed in commercial applications in the prior art. The preferred embodiment applies this new method to the fabrication of either (1) large memories (e.g., having greater than 100 million bits of electronic data storage) as the principal function of the overall circuit, or (2) very large circuits requiring at least one processor function (useful for other tasks other than circuit self-testing and configuration) which incorporates memory and I/O ports together within the overall circuit. In general, implementation of this method requires a re-organization of the relationships of prior-art circuits (e.g., memories), typically manufactured as electrically isolated and repeating patterns (or die) on a prior-art wafer as whole circuits. These prior-art circuits (e.g., memories) become sub-circuits of a larger overall circuit which follows an architecture according to this new method. This larger overall circuit includes, as a minimum, a specialized processor circuit described above which accomplishes the tasks of recording the electrical failures or defects which occur in a random manner at some average density across the overall circuit, and then acts to re-configure the remaining functional (memory) sub-circuits to electronically perform as a useful circuit. It is also practical to provide for the utilization of the processor circuit for other tasks as well thereby enabling not only overall circuit yield enhancement by this method, but also a useful processor function to be used for other computational tasks following electrical self-test and self-configuration of the overall circuit.

The implementation of this new method involves special considerations as it requires the incorporation of new circuits and software algorithms which collectively act to prevent certain catastrophic failure modes which become possible from the use of this type of architecture. These are:

(a) Defects in the communication busses, such as the undesirable electrical connection of two parallel interconnect paths together or the undesirable breakage (or open-circuit) of any of the individual interconnect conductive pathways along their patterned lengths. This failure mode is of interest because, should this type of defect occur and all of the sub-circuits are patterned to be connected to the same set of contiguous and conductive pathways, then the entire circuit fails to function regardless of the functionality of the processors or other sub-circuits. The preferred embodiment employs a concept of using segmented communication busses in which a portion of each sub-circuit communication port extends out across an adjacent buss, using amplifiers to conditionally pass the signals along the conductive pathways comprising each buss, thereby causing the buss to become segmented. Should a defect in a communication buss occur, then only a small conductive pathway section is affected (e.g., between the amplifiers in neighboring communication ports). The remaining functional pathway sections are re-configured to operate around the non-functional pathway sections by the control processor. This is done by the control processor sending a control instruction to each communication port. Each of these instructions is created by the control processor following the processor's sequential test of each segmented pathway section. This instruction is then electronically recorded in a small register or memory within each communication port and is used to either activate the amplifiers within the port which pass each signal along each conductive pathway section, or to provide for the passing of each signal directly between the two communications ports contained within each sub-circuit by way of conductive pathways contained within the boundaries of each sub-circuit.

(b) Defects in the communication ports which connect to the segmented communication busses. Similar to above, it is possible that one of these defects can cause a failure which impacts the functionality of a segmented communication buss. In addition a failure in both communication ports also causes the associated sub-circuit to fail as well. The physical area required for the communications ports is made to be a small fraction of the area of the remainder of each sub-circuit in the preferred embodiment. As a result, there exists a relatively low probability for failures to occur in both of these communication ports simultaneously, when compared with probability of failure of the remainder of each sub-circuit.

(c) Defects in all of the processor sub-circuits. If this occurs, then the overall circuit becomes useless. Although the probability for this is finite, this new method addresses this probability as part of an overall demonstration of circuit yield improvement through a concept in redundant processor implementation which serves to minimize the probability of a complete failure of this type. During the start-up algorithm, each of the redundant processors acts to verify its own operation, then if functional, establish whether or not it logically takes control of the overall circuit. By this method of operation, only one of the plurality of redundant processors must function in order to provide for a useful overall circuit.

(d) Defects in the other sub-circuits. The preferred embodiment of this invention uses memory elements for a majority of the sub-circuits, such that these memory elements are further sub-divided into pre-defined memory "blocks" by the action of the start-up algorithms performed by the control processor sub-circuit and the use of internal processor RAM for addressing memory in the other sub-circuits. Each memory block is defined to be an optimum size based on the available RAM capacity in the processor used to record the addresses of these blocks, of which any combination can be defective. For example, the preferred embodiment implements memory blocks whose size is set to be 32,768 bits while the memory sub-circuit size is set (by physical layout) to be 262,144 bits. This memory within each sub-circuit is, in the preferred embodiment, the same physical size as that used for the processor sub-circuits, resulting in straight communication busses between these sub-circuits. The use of a smaller block size enables the processor to utilize a higher resolution in the location of electrical defects within portions of each memory sub-circuit, resulting in a higher average percentage of the memory within the overall circuit being made useful by this invention, given a fixed number of defects existing within an overall circuit. A minority of the sub-circuits are not memory elements as described above, but rather function to perform specialized interface or support functions such as serial or parallel data I/O (input/output) ports which function to pass signals to/from other external circuits; floating-point arithmetic sub-circuits for math computations; or graphics output sub-circuits for providing video data for presentation on cathode ray tubes (or monitors). For these types of sub-circuits, the use of smaller "blocks" described above for the purpose of increasing yield is difficult to apply. Therefore, the preferred embodiment includes the implementation of redundant copies of these latter sub-circuits within the overall circuit, such that the probability that all of these sub-circuits to be simultaneously non-functional is small when compared with the other probabilities for overall circuit failure as described above. The control processor also performs a periodic test of each of the I/O port sub-circuits, from which the processor utilizes only the functional I/O port sub-circuits and de-activates the others. Communications with an external circuit is by way of the functional I/O port sub-circuits to redundant external interfaces, all of which are preferably functional in the use of the preferred embodiment.

In summary, the preferred embodiment of this new method and apparatus enhances the production yield of very large circuits which use existing microelectronic technologies capable of producing processors, memories, and I/O as individual circuits in accordance with the prior art. The preferred embodiment requires changes to the methods by which these circuits are patterned on a wafer to become sub-circuits of an overall larger circuit, which acts to identify the locations of its own electrical defects and then re-configures the overall circuit to be functional under the control of a central processor sub-circuit. The overall circuit can range in physical size from approximately one-quarter of a square inch to a full-size, eight-inch diameter wafer. According to the preferred embodiment, it is demonstrated that single monolithic computers containing approximately 767,000,000 transistors can be fabricated with electrical functional yields averaging 92.7%. The advantages of implementing this method over the prior art methods are: (a) lower cost to fabricate an equivalent large integrated circuit or electronic computing system, (b) the ability to combine processors, memories, and other support circuits as one integrated circuit entity improves electronic operating speed and reduces system power dissipation through the elimination of relatively large capacitances associated with multiple microelectronic packages and interface circuits, otherwise required by the prior art methods, (c) reduction of physical size and weight for an equivalent electronic circuit or system made with prior art methods, (d) increase in the overall circuit reliability over time as any progressive electronic failures that occur are removed through the optionally recursive execution of the start-up algorithms according to this method, and (e) the elimination of the requirement to use other electronic wafer probe test systems to identify functional die containing large circuits comprising more than 100,000 transistors.

BRIEF DESCRIPTION OF THE DRAWINGS

The foregoing and other objects, features, and advantages of the invention will be apparent from the following more particular description of preferred embodiments as illustrated in the accompanying drawings. These drawings use reference characters which refer to the same parts throughout the various views. The drawings are not necessarily to scale, while emphasis is placed upon illustrating the principles of the invention.

FIG. 3 is a diagram of Detail A, as illustrated in FIG. 1, for the segmented communications busses and communications ports which are located around and within three memory sub-circuits and around one externally attached processor sub-circuit in accordance with an alternate embodiment of this invention.

DETAILED DESCRIPTION OF THE INVENTION

Figure 1:
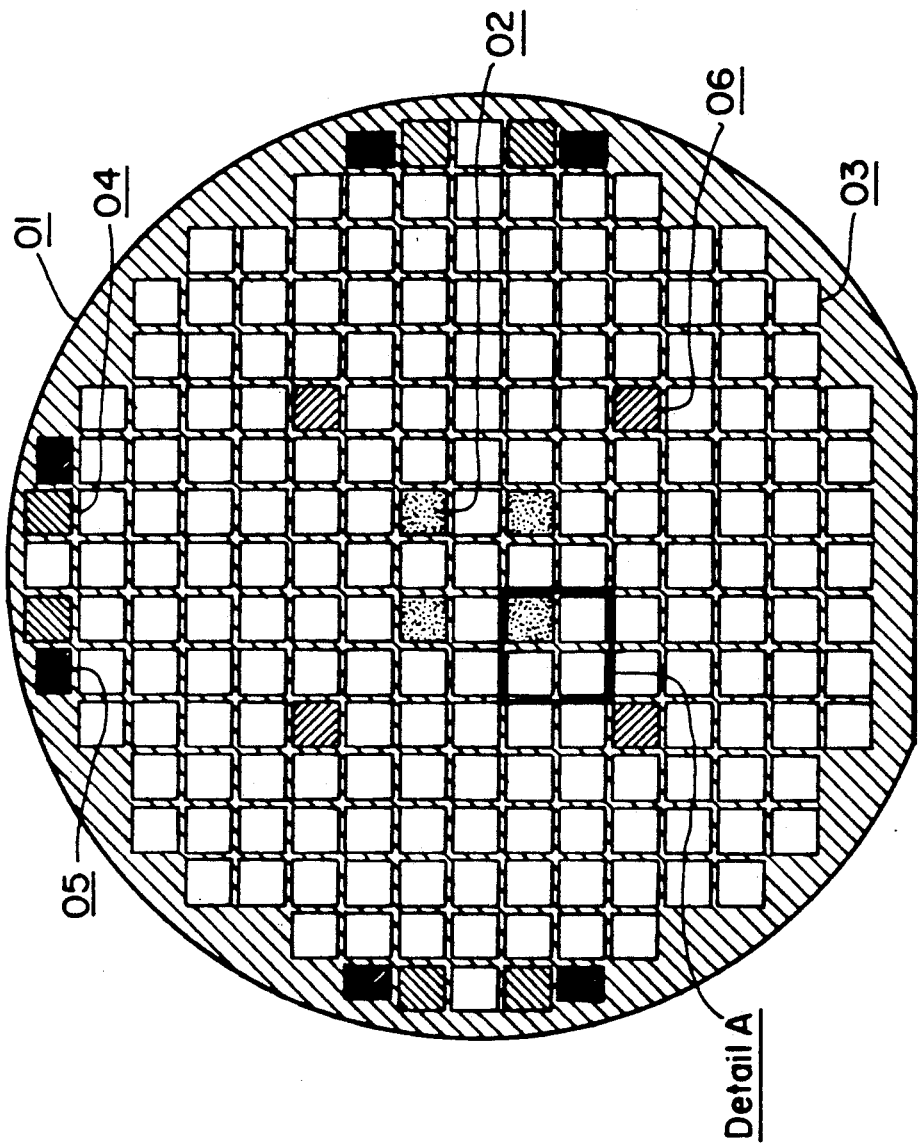
FIG. 1 is a diagram of a semiconductor wafer whose physical organization and layout comprises one overall circuit which is in accordance with the preferred embodiment of this invention.

FIG. 1 is a physical layout of a suitable substrate, such as semiconductor wafer 01 for formation of integrated microelectronic circuits, which is manufactured in accordance with the preferred embodiment. This layout illustrates the fabrication of one overall microelectronic circuit which is made to occupy most of the available surface area of the wafer 01.

A plurality of nearly identical processor sub-circuits 02 (sometimes referred to simply as processors) are located near the central regions of the wafer 01, such that they would have the highest probability for being functional, although this is not a necessary requirement by this new invention. Each processor sub-circuit includes typical state-of-the-art processor units, such as an interface unit, a read only memory unit, a random access memory unit, an arithmetic and logic unit (ALU), and a timing and control unit. Processors 02 differ only in the value of their priority codes which are photolithically or electronically programmed into a read-only memory within or near the physical boundaries of each processor 02. Each of these processors function identically to identify which of the other processors are functional within wafer 01, to automatically select one of themselves to become the control processor, to act to configure electronically the function of the overall circuit on wafer 01 to be a useful circuit, to communicate with all of the other functional sub-circuits on wafer 01, to learn electronically the locations of the other sub-circuits which do not fully function on the wafer 01, and to then perform any other digital data processing tasks following the periodic completion of these aforementioned tasks. The processor 02 thus instructs the microelectronic circuit on wafer 01 to be configured so as to interconnect and make functional only those sub-circuits, or portions of sub-circuits, not impaired by fabrication defects which are randomly occurring at some known density across the surface of the wafer. The control processor 02 does this through the implementation of certain recording and decision algorithms, encoded within its read-only memory unit, according to the invention.

A plurality of identical sub-circuits 03 are patterned to be approximately the same size as an integral multiple of the size of each processor 02 (or vice versa). In the preferred embodiment, these sub-circuits 03 are all dedicated to performing the same function, e.g., a memory function, and, hence, will be referred to herein as either memories or dedicated sub-circuits. These memories 03 are the same size as the processors 02. A plurality of identical interface I/O port sub-circuits 04 are included on wafer 01 for the purpose of translating electronically (in time and in their voltage levels) the signals from external circuits to those which are compatible with those signals used in the overall circuit on wafer 01, and vice-versa. These circuits are located near the edge of the wafer 01 for the purpose of being physically close to, or containing, places 05 for wirebonds or solder-bumps used for the electrical connection of the overall circuit on wafer 01 to other electrical circuits external to wafer 01.

A plurality of process control monitor patterns 06 may also be patterned on wafer 01. These are used in conventional wafer fabrication for the purpose of in-line process control and verification of key steps during these processes. Patterns 06 are electrically probed both during and after wafer fabrication to perform these verifications as well as to monitor the density of occurrence of electrically fatal defects in representative circuits and patterns which comprise 06.

Figure 2:
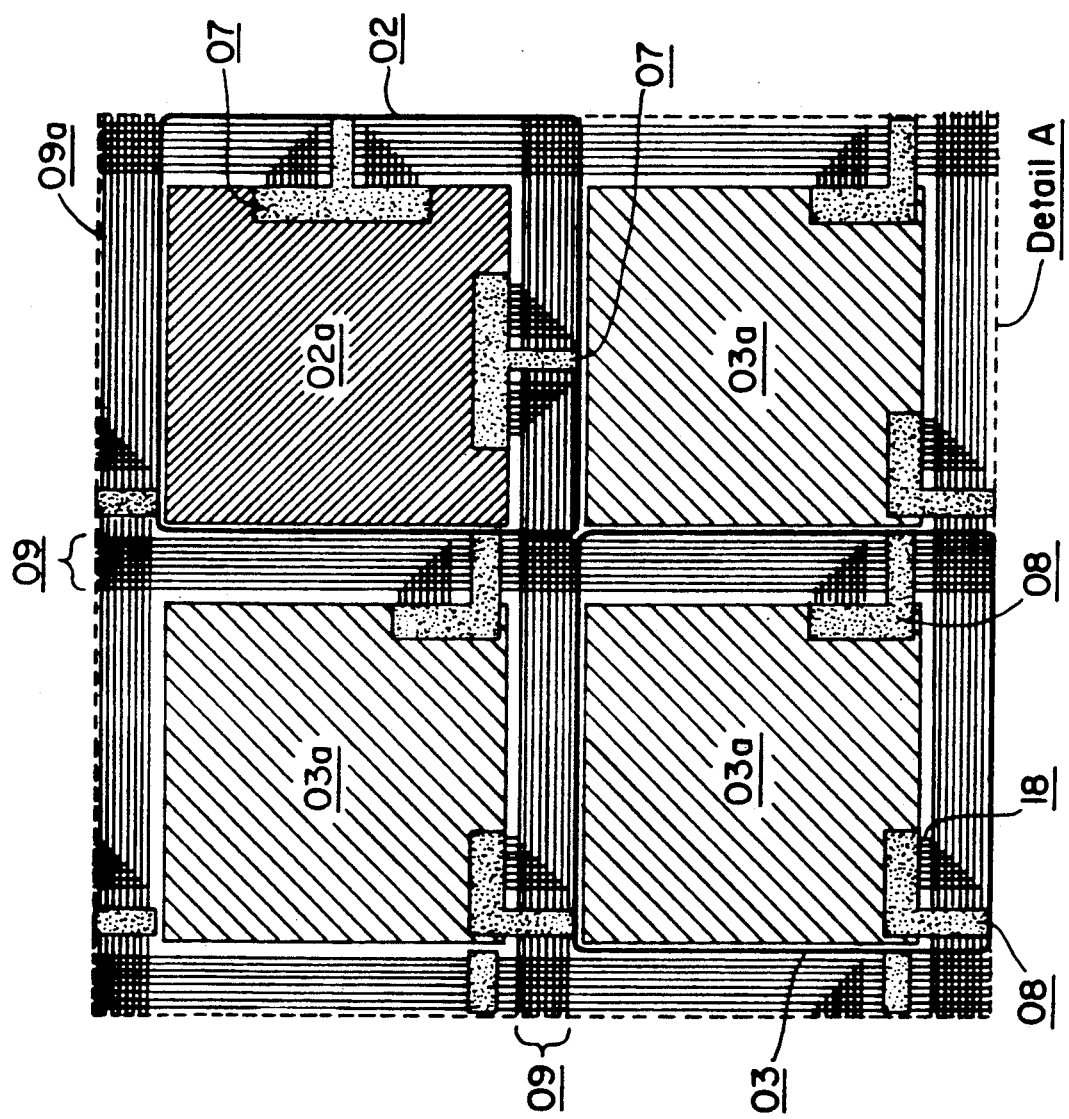
FIG. 2 is a diagram of Detail A, as illustrated in FIG. 1, for the segmented communications busses and communications ports which are located around and within one processor and three memory sub-circuits, in accordance with the preferred embodiment of this invention.

FIG. 2 illustrates the physical location of the segmented communication busses 09 within Detail A illustrated in FIG. 1. These busses are placed in each of two straight and orthogonal directions on wafer 01 and are positioned between the processor and memory units 02a and 03a contained within sub-circuits 02 and 03, respectively. Note: For simplicity, only four sub-circuits are shown in FIG. 2, i.e., one of the processor sub-circuits 02 and three of the memory sub-circuits 03. Note that processor sub-circuit 02 is comprised of processor unit 02a, two segmented communication busses 09, and two communication ports 07. Memory sub-circuit 03 is comprised of a memory unit 03a, two segmented communication busses 09, and two communication ports 08. Communication busses 09 are comprised of a plurality of individual electrically conducting pathways 09a, each of which is patterned in lines parallel to each other and in one or more layers, separated by an insulating dielectric material such as an oxide or nitride of silicon. Each individual electrically conducting pathway 09a provides for the interconnection of an electrical signal which is common to at least two of the sub-circuits on wafer 01. Each segmented communication buss 09 comprising a plurality of conductive pathways 09a is bounded by regions of other processor units 02a, memory units 03a (shown) as well as by I/O interface units within I/O port 04, bonding or soldering regions 05, and process control monitor patterns 06 (not shown). Note: Again, for simplicity, only eight conducting pathways 09a are shown to make-up each communication buss 09 in FIG. 2. It should be understood, however that the number of conductive pathways 09a will depend on the following: the number of bits fabricated as memory within the overall circuit for which address lines will be required; the number of lines required for parallel data communication and the number of processor control lines required. In the present detailed embodiment of FIG. 2, which is capable of storing up to 130.55 M bits, 27 address lines, 32 data lines and 11 control lines, for a total of 70 conductive pathways 09a, are provided.

Two processor communication ports 07 are provided along each of two original orders for each processor unit 02a. These parts function to provide passage (or stoppage) of signals along each communication buss 09 located next to each of two orthogonal sides of the processor unit 02a. A portion of each communication port 07 extends out and across the adjacent conductive pathways comprising a communication buss 09, and is electrically connected to each conductive pathway 09a and controls the passage of electronic signals on each conductive pathway 09a along a buss 09. In this manner, port 07 acts to electronically "segment" a communication buss 09 through either transmitting or blocking electrical signals on buss 09, as controlled by circuits contained within port 07. It is at these physical points of interconnection of port 07 to pathways 09a that these pathways become electrically segmented for the purpose of providing for overall circuit yield enhancement and, as a secondary benefit, electronic speed improvement through these amplifiers contained within port 07.

Two communications ports 08 are also included inside each of two of the orthogonal borders for each sub-circuit 03 or 04 on wafer 01. A portion of each port 08 also extends out and across the communication buss 09 so as to function as a controlling gateway for electronic signals on buss 09; similar to the action of ports 07 associated with each processor sub-circuit 02 In this manner, port 08 acts to electronically "segment" a communication buss 09 through either transmitting or blocking electrical signals on buss 09, as controlled by circuits contained within port 08. It is at these physical points of interconnection of port 08 to pathways 09a that these pathways become capable of being segmented for the purpose of providing for overall circuit yield enhancement and, as a secondary benefit, electronic speed improvement through the use of amplifiers contained within port 08.

FIG. 3 illustrates an alternative embodiment to this invention where the wafer 01 is fabricated to comprise all of the sub-circuits, communications ports and busses of the preferred embodiment except for the use of an externally attached processor sub-circuit 02a' in place of the monolithically integrated processor unit 02a of the preferred embodiment. FIG. illustrates Detail A from FIG. 1 for the physical location of processor 02' for this alternative embodiment. In this alternative embodiment, wafer 01 is manufactured identical to the preferred embodiment except that an area 25, approximately the size of the externally attached processor unit 02a', is left open (e.g., without fabricating any electronic circuitry) and on-wafer bond pads 22 are provided in place of each processor unit 02a of the preferred embodiment of FIG. 2. This alternative embodiment permits the manufacture of wafer 01 comprising all of the necessary circuitry except the processor units 02a' to be separate from the manufacture of the processors 02a'. In this embodiment, each of these processor units 02a' are manufactured on a different semiconductor wafer followed by their dicing into individual die once each of these processor units is tested to be electrically functional. It is necessary that the size of each alternate processor unit 02a', once diced, be small enough such that each can be die-bonded to wafer 01 within the aforementioned open area 25 on wafer 01. Then, each alternate processor unit 02a' is electrically connected by wire-bonds 23 attached to bond pads 21, included as part of alternate processor sub-circuit 02', and attached to bond pads 22 included on wafer 01, as shown in FIG. 3. As a result, this alternative embodiment provides for the function of each processor sub-circuit 02', each containing one externally bonded processor unit 02a', two communication ports 07 and two segmented communication busses 09, to be identical in operation to the processor sub-circuit 02 of the preferred embodiment.

An alternative method for the electrical connection of these alternate processor units 02a' onto wafer 01 is by the use of a solder-bump technology. This is accomplished by manufacturing each processor to include solder on each of its bond pads 21, and such that the position of each of these bond pads 21 is patterned to physically line up with each respective bond pad 22 on wafer 01 so that the alternative processor unit 02a' can be soldered into position. In this operation, the upper surface of alternative processor unit 02a' is turned to face downward with respect to the surface of wafer 01 so that the electrical connection, between these two surfaces, may be accomplished by the use of solder at each physically aligning and electrically contacting bond pad pair 21 and 22.

Figure 4:
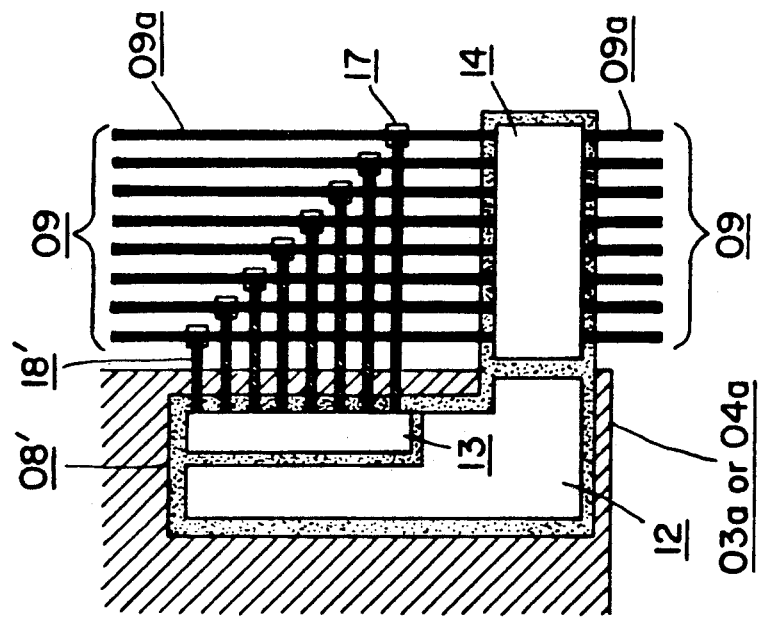
FIG. 4 is a detailed diagram for a communication port which is located within either the memory or I/O port sub-circuits in accordance with the preferred embodiment of this invention.
Figure 5:
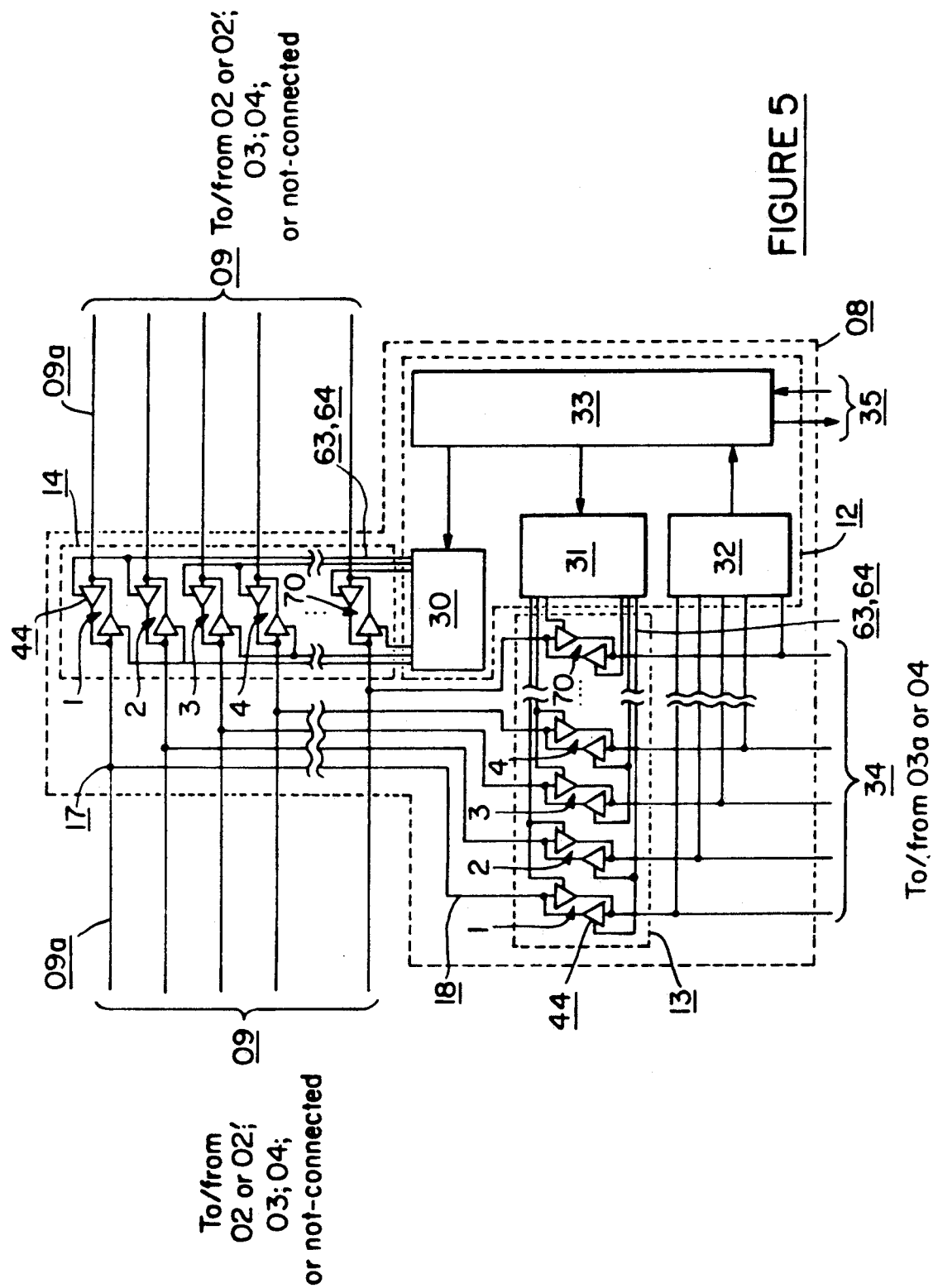
FIG. 5 is an electrical block diagram for a communication port illustrated in FIG. 4 in accordance with the preferred embodiment of this invention.

FIGS. 4 and 5 further illustrate the physical layout and detailed electronic composition, respectively, of a communication port 08 used in sub-circuits 03 and 04, according to the preferred embodiment of this invention. Communication port 08 is fabricated to perform several functions:

First, it amplifies signals received at amplifier unit 14. Each conductive pathway 09a on either side of unit 14 is connected to the input of one amplifier 44 and to the output of a second amplifier 44, both of which reside in 14. In this configuration, only one of these amplifiers is activated to perform an amplification function at a time, by control of logic contained within unit 30 which is a part of the communication port logic 12. Each of these amplifiers 44 has a high input impedance (typically greater than 5,000 ohms for the operating frequencies of interest), while the output of each amplifier, when activated by logic 30, has a low output impedance (typically 600 ohms for the operating frequencies of interest). When an amplifier 44 is not-activated, its output impedance becomes approximately equal to its input impedance. A pair of amplifiers 44 are connected together and controlled in this manner creates a "bi-directional tri-state" amplifier function. This function is capable three separate modes of operation under control of logic within 30: (1) to amplify and pass a signal from one conductive pathway 09a to a second pathway 09a, (2) to amplify and pass a signal in the reverse direction from the second pathway to the first pathway, or (3) to not amplify, or not be activated, or pass any signals on either pathway to the other. Each pair of amplifiers 44 comprising a bi-directional tri-state amplifier function are electrically connected to two conductive pathways 09a, each of which is contained within adjacent communications busses 09. When 44 is activated, it performs an amplification function by providing both voltage and current gain when outputting a logic replica of the signal present at its input, and sends this signal in one direction at a time. The amplifiers 44 within unit 14 also provide for an improvement in operating speed regarding the sending and receiving of signals on busses 09. This speed improvement results from the reduction in the characteristic signal time constant on each pathway 09a defined by the product of the resistance of an amplifier's output, which is connected to a conductive pathway 09a, and the capacitance coupling each pathway 09a to the rest of wafer 01. In the preferred embodiment, the inclusion of amplifiers 44 within unit 14 at regular intervals across wafer 01 reduces the overall coupling capacitance of each segmented pathway 09a. When compared to the case where these amplifiers are not used at regular intervals (busses are not segmented) and each conductive pathway 09a is electrically connected together as one larger pathway throughout the overall circuit, then only one amplifier 44 (within a sub-circuit 02, 03, or 04) will output to each pathway at a time. As a result, this amplifier having a nominal output impedance will output its signal into a much larger capacitance, thereby increasing the characteristic time constant of the pathway. In the preferred embodiment, this pathway 09a time constant is reduced by a factor of between 10 and 1,000, while the increase in the overall buss signal amplification delays caused by the inclusion of these amplifiers 44 within 14 at regular intervals contributes less than 10% to the overall buss delay after they are segmented. Therefore, the overall delay time for passing a signal from one sub-circuit to another across the physical dimensions of the overall circuit is improved by a factor of between 10 and 1,000 through the use of these amplifiers 44 in units 14 at regular intervals. Second, port 08 has an amplifier unit 13 which comprises a pair of amplifiers 44, one input and one output each electrically connected to one the conductive pathways 09a by way of conductive cross-interconnect 18 and interconnect VIAs 17, and each amplifier 44 is controlled by logic unit 31 which is part of communications port logic 12. Amplifier unit 13 operates in an identical bi-directional tri-state manner as the amplifiers in 14 (see above) with regard to the passage or stoppage of signals between communication buss 09 and interior sub-circuit communication buss 34. However, upon the initial application of electrical power or the initiation of an overall circuit re-start instruction to the control processor sub-circuit (see FIG. 9), the amplifiers in unit 13 are initially enabled to pass signals from one segmented communication buss 09 to buss 34 only, while amplifiers in unit 14 are disabled entirely. This procedure enables the control processor sub-circuit to send a port control instruction to each sub-circuit 03 or 04 in order to enable the use of the port 08 in further testing of the other (or next) segmented communication buss 09 connected to the port 08 at amplifier unit 14, as well as to test the remaining portions of sub-circuit 03 or 04. This port control instruction is stored in a small memory 32, included as part of communication port logic 12, and this instruction is sequentially modified in time as the control processor evaluates the results of the tests performed on that port 08, the next segmented communication buss 09, and the remainder of the associated sub-circuit itself. Should these tests be entirely successful at a particular port 08 and sub-circuit 03 or 04, the control processor modifies this instruction to enable amplifier units 13 and 14 for normal operation. If an electrical failure is detected in the next segmented communication buss 09 and the port 08 was tested to be functional, then only amplifier unit 13 is enabled for normal operation and amplifier unit 14 is instructed to remain disabled. And, if an electrical failure is found within port 08, amplifier unit 13 is not enabled to send signals onto buss 09 or 34, and amplifier unit 14 is left in a disabled state. By this method, the control processor configures each port 08 to function conditionally based on the success of these tests (see description of FIG. 9), such that any defective circuits become disabled and/or un-used. The control processor sequentially tests each of the conductive pathways 09a, cross-interconnects 18, VIAs 17, and ports 08, beginning adjacent to the control processor and proceeding outward throughout the remainder of wafer 01, to identify fabrication defects, including electrically conductive bridges (or short-circuits) between the various conductive pathways and electrical or physical separations along the lengths of any of these conductive pathways.

And, third, each port 08 provides for the normal communication of signals between the control processor and each sub-circuit 03 or 04 through the amplifiers 44 comprising amplifier unit 13. Control signals 35 to/from port control logic unit 33 enable each communication port 08 to function as an interface to other internal memory (e.g., memory unit 03a) or I/O port circuitry contained elsewhere within each sub-circuit 03 or 04. This other internal memory or I/O port circuitry is electrically connected to interior communication buss 34. Output signals from port control logic 33 (which are part of the control signals 35) instruct this other internal circuitry as to availability of signals received from the control processor which are present at buss 34. Input signals to logic 33 (which are part of the control signals 35) instruct port 08 when to send data present at buss 34 to the control processor sub-circuit.

Figure 6:
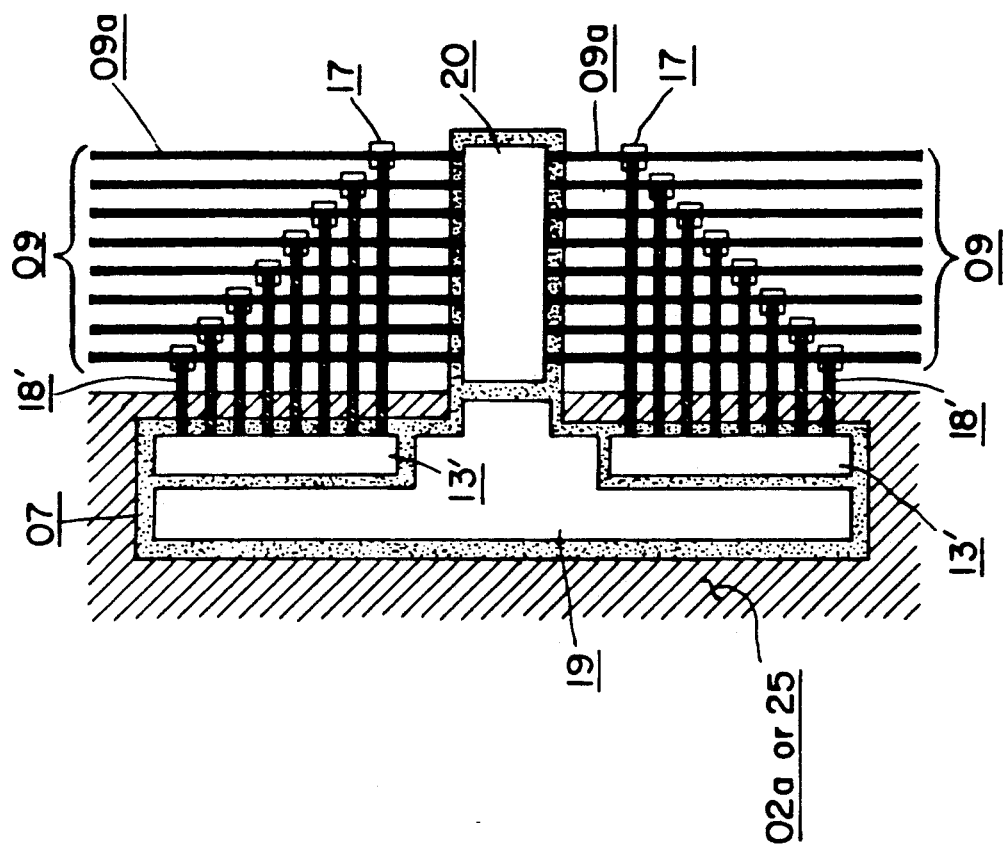
FIG. 6 is a detailed diagram for a communication port used with processor sub-circuits according to the preferred embodiment of the invention.
Figure 7:
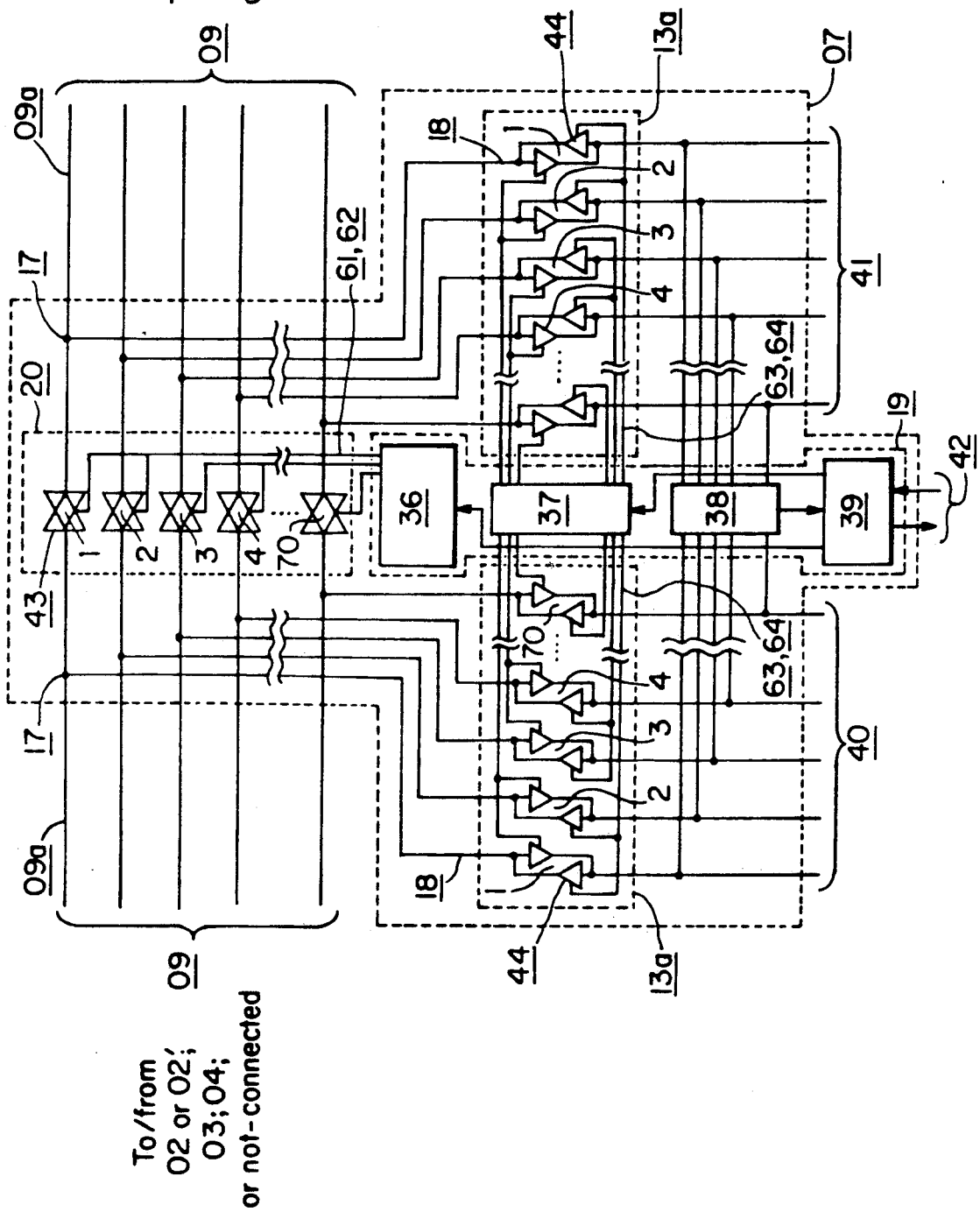
FIG. 7 is an electrical block diagram for a communication port illustrated in FIG. 6 according to the preferred embodiment of the invention.

FIGS. 6 and 7 further illustrate the physical layout and detailed electronic composition of a processor sub-circuit communication port 07 according to the preferred embodiment of this invention. Port 07 provides for the passing of signals between each of two segmented communication busses 09 and a processor unit 02a or 02a' under the control of logic unit 19 which, in turn, controls amplifier units 13a. Amplifier units 13a meet each interconnect conductive pathway 18 in each of two locations on either side of the transmission gates 43 of gate unit 20. Note: 70 such gates are provided, one electrically connected to each of 70 conductors 09a, in the preferred embodiment. Each cross-interconnect pathway 18 is electrically connected to a respective conductive pathway 09a by the use of VIAs 17. Transmission gates 43 of gate unit 20 provide two functions:

First, regarding those processor units 02a or 02a, which are either defective or otherwise shut-down by the control processor, the transmission gates 43 in ports 07 are fabricated to be in an electrically conductive state at the initial application of power or following a processor re-start instruction (see description of FIG. 9), so that the signals on each of the conductive pathways 09a in communication busses 09 can pass without interruption by a disabled or defective processor unit 02a or 02a'. This action serves to improve the number of sub-circuits which are successfully configured by the control processor, which by this preferred embodiment, also determines the available memory capacity within the overall circuit on wafer 01.

Figure 9:
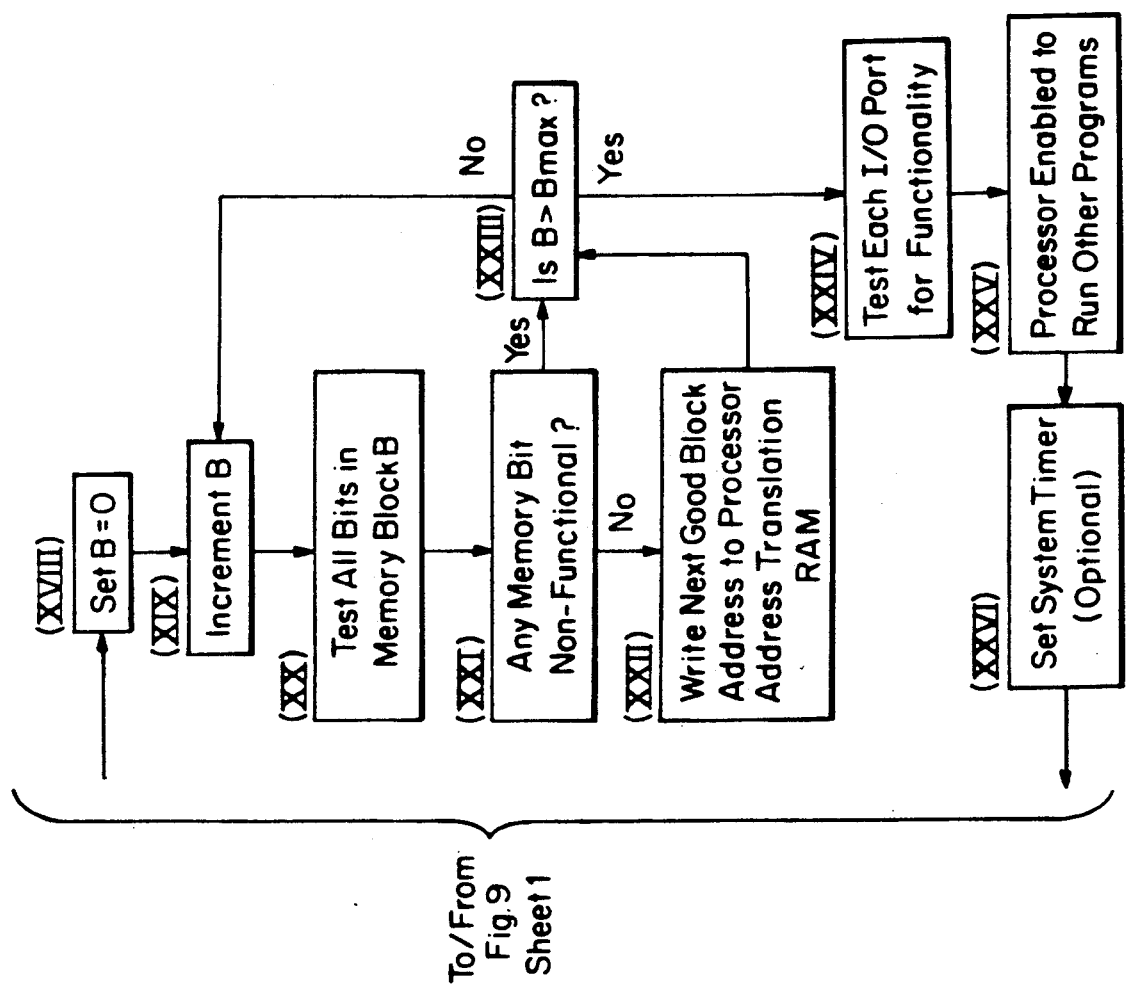
FIG. 9 is a flow chart for a processor sub-circuit start-up algorithm for self-test, defect identification and configuration of an overall circuit according to the preferred embodiment of the invention.

Second, if a particular processor unit 02a or 02a' is determined to be the control processor for the overall circuit, the associated gates 43 in unit 20 are placed into an electrically non-conducting or inactive state to permit the control processor to sequentially search the wafer 01 in each of four separate quadrants, or quarters, in accordance with the start-up algorithm illustrated in FIG. 9. This procedure is necessary so that the controlling processor knows where it is searching at all times without the requirement to read an encoded address from each sub-circuit 03 or 04. Otherwise, it would be necessary to either perform a wafer probe (to electrically program each sub-circuit) or to individually fabricate a custom photolithic pattern (e.g., a metal layer) for each sub-circuit, either of which will increase the fabrication expense of the wafer 01. Each transmission gate 43 within unit 20 is controlled by logic 36 to either be in a conductive or a non-conductive state, the conditions for which are described above. These gates 43 do not have the ability to amplify signals received on conductive pathways 09a while in the conductive state, as is the case described above for amplifiers 44 within ports 08. To be specific, these gates have no current or voltage gain; rather, they act as switches with finite on and off impedances. In this manner, these gates 43 can act to cause electrical non-conduction of signals on busses 09, or "segmentation", identical to the inactive state for amplifiers 44 in unit 14 under the control of logic 30, as described above for port 08. The port control logic 39, a small memory 38, and enabling control logic 37 and 36 perform parallel functions to logic 33, 32, 31 and 30 used in each port 08, as described above. Pairs of amplifiers 44 are configured to function as bi-directional tri-state amplifiers within each amplifier unit 13a, identical to those used in amplifier unit 13 within ports 08. However, logic unit 39 sends and receives interface control signals 42, as well as data signals on interior busses 40 and 41 directly to the controlling processor 02a or 02a' within the processor sub-circuit 02 or 02'. This is different from the parallel functions by logic 33, 32, 31 and 30, comprising ports 08, which operate to communicate with the control processor sub-circuit 02 or 02' by way of segmented communication buss(es) 09.

Figure 8:
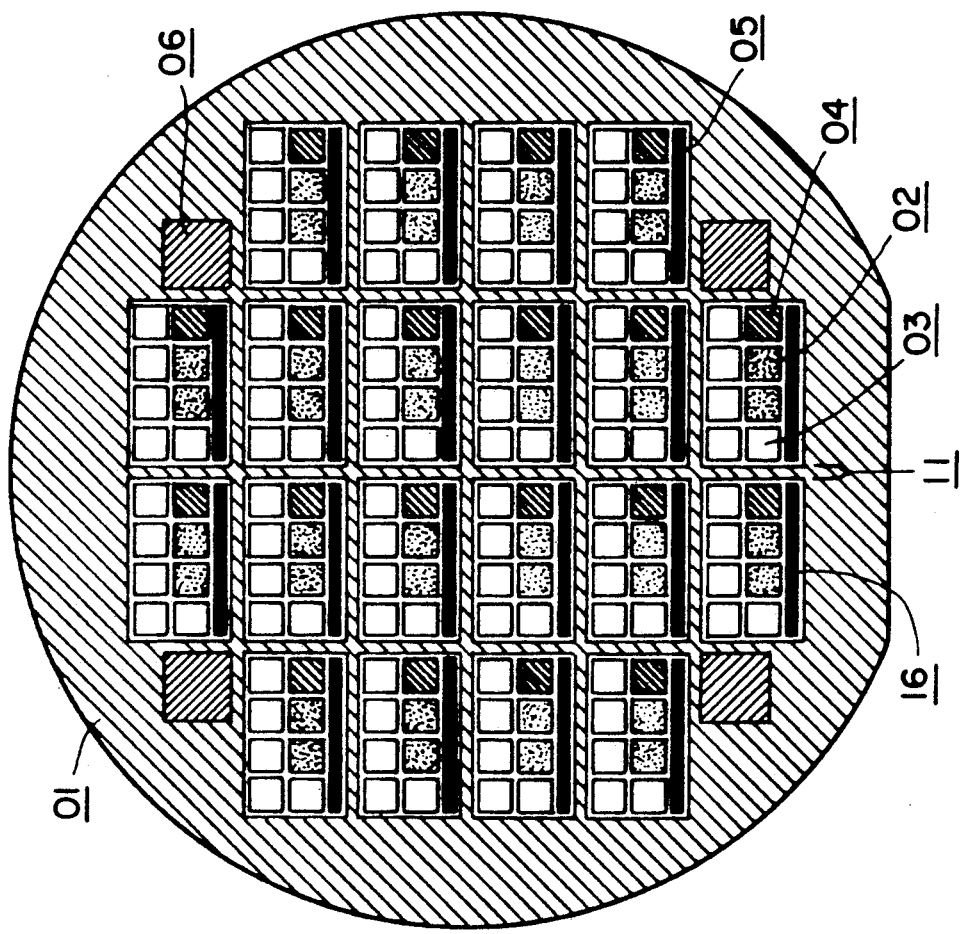
FIG. 8 is a diagram of a semiconductor wafer whose physical organization and layout is in accordance with an alternative embodiment of this invention. In this figure, a plurality of circuits are patterned on the wafer.

FIG. 8 illustrates a semiconductor wafer 01 whose physical organization and layout is in accordance with an alternative embodiment of this invention. In this figure, a plurality of overall circuits 16 are patterned on the surface of the wafer 01, such that each overall circuit 16 is organized using the method of this invention. In this case, each of the overall circuits 16 contains a plurality of processors 02, memories or other sub-circuits 03, an I/O port sub-circuit 04 and wirebond or solder-bump areas 05 in a similar manner as does the preferred embodiment in which one overall circuit occupies an entire wafer 01. Each overall circuit 16 uses the same methodology of the invention to optimize the fabrication yield for each circuit, thereby maintaining (to a lesser degree) all of the advantages for the preferred embodiment cited above, but for a smaller overall circuit. In this alternative embodiment, the wafer is later diced (or sawed) along dicing pathways 11 in order to separate and make useful each of the fully operational circuits. Included is a plurality of process control monitors 06 on wafer 01 as required to verify proper fabrication and defect density for wafer 01.

FIG. 9 is a flow chart for the processor start-up and overall circuit test algorithm, encoded in a read-only-memory unit which is included within the boundary of each processor sub-circuit 02 or 02'. This algorithm is performed after a power-up reset when all amplifiers 44 within unit 14 of communication ports 08 are disabled or non-conducting, and transmission gates 43 within unit 20 of communication ports 07 are enabled or in a conducting state. The following is a description of the variables used in the algorithm:

"Quadrant" controls which one of the four quarter sections of the overall circuit or wafer is being tested or configured. The origin of each quadrant is the site of the controlling processor sub-circuit 02 or 02'.

"X" is the number (or address) of the communication port in a memory sub-circuit 03 or I/O port sub-circuit 04 along the horizontal or X direction of the quadrant which is being tested or configured by the processor sub-circuit 02 or 02'.

"Y" is the number (or address) of the communication port in a memory sub-circuit 03 or I/O port sub-circuit 04 along the vertical or Y direction of the quadrant which is being tested or configured by the processor sub-circuit 02 or 02'.

"T" is a testing variable which is used to instruct the processor sub-circuit 02 or 02' to test and configure the wafer twice; each quadrant is first tested and configured in the "X", then "Y", directions ("T"=0); this is followed by a second round where the above tests are performed in the "Y", then "X", directions ("T"=1). This double testing increases the number of memory sub-circuits 03 and I/O port sub-circuits 04 which are successfully made functional by the processor sub-circuit 02 or 02', particularly if there exists a large number of defective sub-circuits and communication busses close together in a small region on the wafer.

"B" is the number of the block address referring to all of the memory contained in sub-circuits 03 within the overall circuit. B multiplied by the memory block size is the memory address for those bits which are at numerical addresses which are an integral multiples of the block size.

This algorithm is comprised of several software routines, each identified as routine I through XXVI, and each of which are executed in the following conditional sequence:

Step I: Electrical power is applied to the overall circuit. When this is done, all amplifiers 44 in all communication ports 07 and 08 are disabled, or placed in a non-conductive state. Transmission gates 43 in processor communication ports 07 are placed into a conductive state. Double-gated structures and resistors used in series as part of each amplifier 44 input and transmission gate 43 control line collectively insure a high probability that no port will fail to electrically short-circuit any of the conductive pathways 09a or 18 which are electrically contiguous to all of the processors 02 included in the overall circuit.

Step II: Each processor sub-circuit performs a self-test. Internal memory and programming redundantly included within each processor sub-circuit 02 or 02' enables this test to be completed with a high probability of confidence in the determination of a fully functional processor.

Step III: Each processor sub-circuit 02 or 02' transmits a status word to three of the conductive pathways 09a directly connecting the plurality of processors together. These three pathways are patterned separately from, and are place next to, the other 70 pathways (in the preferred embodiment) required for communication with the other sub-circuits 03 and 04. This status word is read by all other functional processors to inform them of the functional or non-functional status of each processor.

Step IV: Each functional processor then logically determines if it becomes the controlling processor by matching its programmed priority code (1 through 4) with the lowest priority code (or optionally, the highest priority code) identified for all other functional processors. Only one processor sub-circuit 02 or 02' selects itself to take control of the overall circuit; the others are disabled (either temporarily or permanently while the electrical power is applied to the overall circuit).

Step V: Software initialization: the control processor sub-circuit 02 or 02' sets internal variables "X", "Y", "Quadrant", and "T" to zero.

Step VI: Increment "Quadrant" to the next integer value.

Step VII: Increment "X" to the next integer value.

Step VIII: The control processor performs a test of all communication ports on the horizontal axis of the quadrant being tested. This test comprises verification of the integrity of each conductive pathway 09a comprising each communication buss 09 through all previously enabled or configured communication ports 08 along the horizontal axis of the overall circuit.

Step IX: If the test in Step VIII fails, then the next port 08 along the horizontal axis of the quadrant being tested remains disabled (no port enable instruction is sent), and the control processor then switches to testing in the vertical axis of the overall circuit.

Step X: Control processor 02 or 02' performs a test of all communication ports on the vertical axis of the quadrant under test which have been configured at each time this test is done. This test comprises verification of the integrity of each conductive pathway 09a comprising each communication pathway 09 through all previously enabled or configured communication ports 08 along the vertical axis of the overall circuit.

Step XI: If all conductive pathways 09a and previously enabled ports 08 are functional by the test in Step VIII, then a port control instruction is sent to the input of the next port 08 in a horizontal direction which had been disabled up to this point in time. This instruction is interpreted by the port 08 to enable itself so as to configure its operation to send and receive signals to the next disabled port 08 or to the outer horizontal limit (in the quadrant being tested) of the overall circuit.

Step XII: If all conductive pathways 09a and previously enabled ports 08 are functional by the test in Step X, then a port control instruction is sent to the input of the next port 08 in a vertical direction which had been disabled up to this point in time. This instruction is interpreted by the port 08 to enable itself so as to configure its operation to send and receive signals to the next disabled port 08 or the outer vertical limit (in the quadrant being tested) of the overall circuit.

Step XIII: If there is a failure from Step X, the control processor checks to determine if the vertical address variable "Y" has exceeded a pre-defined value, "Ymax", indicative of the vertical outer boundary of the overall circuit. This value is the maximum number of sub-circuits 03 or 04 separating any processor sub-circuit 02 or 02' from the farthest boundary of the overall circuit. If this is true, transfer of the execution of this algorithm is made to Step XV. Otherwise, transfer is made to Step XIV.

Step XIV: If the vertical address variable Y has not been exceeded, then only the horizontal address variable X is set to zero Then, transfer of the execution of this algorithm is made back to Step VII.

Step XV: At this point, the algorithm has completely tested a quadrant of the overall circuit. This step checks to see if all four quadrants have been tested. If not, transfer of the execution of this algorithm is made back to Step VI.

Step XVI: If all four quadrants have been tested as determined in Step XV, then the control processor checks variable "T" to see if it is 1 (or true). If it is still zero, then execution of this algorithm is transferred to Step XVII. Otherwise, all testing and configuration of communication busses 09 and ports 08 have been completed with the highest percentage coverage of the overall circuit possible. Transfer is then made to Step XVIII for the initiation of memory sub-circuits 03 testing.

Step XVII: This step is executed only if the overall circuit has been fully tested one time in all four of its quadrants. At this time, the control processor is instructed to transpose its testing variables "X" and "Y", as well as to set the variable "Quadrant" to zero and "T"=1 (or true). Transfer of the execution of this algorithm is made back to Step VI. This results in the second testing of all four quadrants of the overall circuit which is identical to the first tests with the exception that these tests are first started in the vertical direction, rather than the horizontal direction (a result of this transposition). As a result, the control processor is better able to "read" around large defective areas, particularly when these areas are close to the control processor sub-circuit 02 or 02'. These second tests are run to completion, resulting in the algorithm returning to Step XVI with "T" = 1 (or true), where branching to Step XVIII occurs.

Step XVIII: The integer variable "B" is set to zero. This variable is used to record the block address of any defective memory blocks within a memory sub-circuit 03 found in the subsequent memory tests. In the preferred embodiment, this block size is set to 32,768 bits of memory; the maximum value possible for "B", or "Bmax" is 3,984.

Step XIX: Increment the variable "B" to the next integer value.

Step XX: The control processor sub-circuit 02 or 02' performs a memory test of each bit contained within memory block "B". Data is sequentially written to, then read back from, each memory storage cell within the addressed block. These tests include selected combinations of data patterns which result in a high confidence of successful determination of a fully functional memory block.

Step XXI: If the tests in Step XX show that any memory bit is non-functional in Block "B", transfer of the execution of this algorithm is promptly made to Step XXIII. Otherwise, transfer is made to Step XXII.

Step XXII: When a functional memory block is found, the control processor records this block address in its internal random access memory (RAM) unit for the purpose of follow-on translation the addresses that the processor sends out to the rest of the sub-circuit for memory or I/O operations. This translation is required as software which runs at the processor following this algorithm typically requires a contiguous sequence of addresses of good blocks of memory and I/O in order to be most useful; however it is a virtual certainty that some of the memory blocks fabricated within the overall circuit will be defective from fabrication. In execution of this step, the control processor operates to compress a larger collection of block addresses, associated with the total number of memory blocks fabricated within an overall circuit, into a smaller collection of only functional block addresses. These addresses are written into the processor RAM in sequence with respect to those addresses made to this RAM by the processor. After this step is executed for all values of block addresses up to "Bmax", the processor uses this RAM to subsequently translate the most significant bits for those addresses which are then sent out to the rest of the sub-circuit. In the preferred embodiment, there are a total of 27 bits required to address the 130.55 M-bits fabricated on the wafer 01. The block size is set to 32,768 bits, so that there are a maximum of 3,984 blocks (this is "Bmax") on the wafer. The processor's RAM must have enough storage capacity to handle this number of block address entries, each of which requires a 12 bit word to address within the processor's RAM. The total RAM required for this address translation function is equal to the number of bits required to address all block address entries multiplied by the total number of blocks fabricated on the wafer, or 47,808 bits (organized as 12 by 3,984) in the preferred embodiment. Once this start-up algorithm is completed, the processor will send its most significant 12 address bits to this RAM, which then outputs a compressed set of 12 bit words which are then sent out as the corresponding address bits to only functional memory blocks for all subsequent read and write operations to/from the control processor. The least significant 15 bits of the 27-bit address word function to access the memory bits within each block.

Therefore, this step of the algorithm instructs the processor to simply store the next functional block address "B", found for the overall circuit in Step XXI, in the next available sequential address location in this processor address translation RAM. During the execution of this step, the processor also keeps a record of the number of blocks which have been defective, so as to determine the upper limit of useful memory within the overall circuit. This information is subsequently used to limit the upper value of control processor addresses, this upper value is sent as part of the system status word to the functional I/O ports described in Step XXIV. Transfer is made each time from this step to Step XXIII.

Step XXIII: The control processor then checks for "B" being greater than the total number of blocks fabricated within the overall circuit. This maximum value is internally set to be 3,984 in the preferred embodiment. If this value has not been exceeded, then transfer is made back to Step XIX. Otherwise, transfer is made to Step XXIV.

Step XXIV: The control processor then proceeds to test all of the I/O port sub-circuits 04 (there are 6 of these circuits in the preferred embodiment) fabricated within the overall circuit. These I/O ports 04 are also connected by identical communication ports 08 and previously configured for operation by the control processor 02 or 02'. Each I/O port 04 is tested out to conductive pathways which make up bond pad sites 05 for functionality. Only those I/O ports which are fully functional are enabled for any subsequent operation. Those functional I/O port sub-circuits are then sent an identical system status word by the control processor which is read by redundant external circuits to record the operating status of the overall circuit.

Step XXV: The start-up algorithm is complete. Transfer is now made to load any other program that the control processor is to perform using the successfully configured memory and I/O port sub-circuits 03 and 04.

Step XXVI: Control processor 02 or 02' may optionally be interrupted to re-perform the algorithm described in Steps I through XXV above without the requirement to remove, then re-apply the electrical power sources to the overall circuit. This can be done to periodically verify the integrity of the overall circuit, particularly in the case of a control processor "crash" resulting in a primary system trap interrupt and re-start instruction to be activated.

An important feature of the present invention is the ability to repair itself after it has been in use. For example, if, after extended use, one or more memory sub-circuits 03 or input/output sub-circuits 04 or a control processor 02 or 02' fails, the wafer 01 may be re-configured by initiating Step XXVI or Step I, so that the algorithm of FIG. 9 is re-run and the process of FIG. 9 results in the re-configuring the communication pathways 09 to isolate any new defective sub-circuits or communication busses, and to bypass all such defective circuits to produce a functional overall circuit. In addition, other processor algorithms are contemplated which have varying capabilities regarding: (a) time of execution and (b) coverage of the overall circuit with respect to the percentage of the overall circuit made to be useful, all of which enable the overall circuit to identify its defective portions and become useful through a sequential, electronic configuration process which uses the physical architecture of sub-circuits of the invention.

Figure 10:
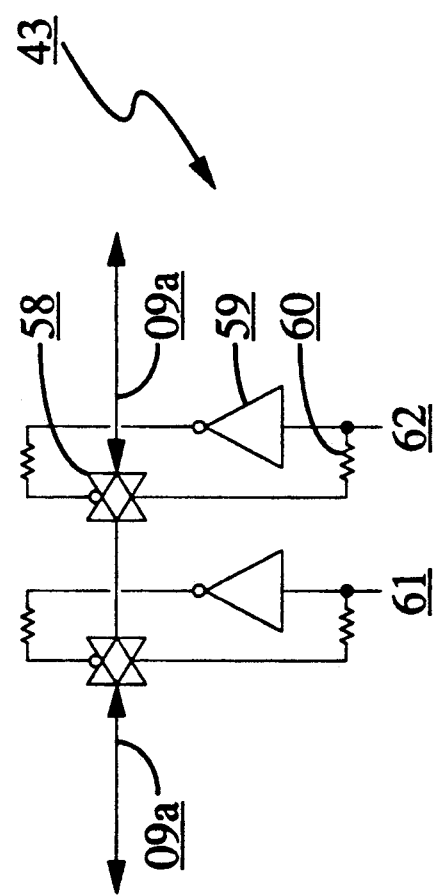
FIG. 10 is a detailed electrical schematic of a transmission gate used in a processor sub-circuit communication port in accordance with the preferred embodiment of this invention.

FIG. 10 is a detailed electrical schematic for a transmission gate, previously identified as 43 in FIG. 7, according to the preferred embodiment of this invention. This transmission gate comprises unit 20 which is the part of processor communication port 07 which extends out and across communication pathway 09, such that each transmission gate electrically connects to two conductive pathways 09a, one on each side of unit 20. Two transmission gate transistor devices 58 are connected in series, such that each device is controlled by separate enabling signals 61 and 62 from control logic 36. This method of fabrication requires that two independent control signals 61 and 62 be provided simultaneously to enable the low-impedance conduction from one input of transmission gate 43 to the other, thereby greatly reducing the failure probability of this gate to an un-controlled conducting mode due to any single failure which occurs either in gate 43 or elsewhere within the overall circuit. Logic inverters 59 are provided as required to provide the necessary complementary signals required to drive each transmission gate transistor device 58. Series resistors 60 are also provided which are chosen to have a value which is small enough to permit the control signals 61 and 62 to reach the control inputs to devices 58 in a maximum allowed amount of time, while these resistors are chosen to be large enough to limit the electrical current in the event of a failure which would otherwise directly connect an input of gate 43, by way of a device 58, to one of the power supply potentials through a very low impedance (e.g., less than 500 ohms), as well as to permit the continuing operation of a transmission gate 43 in a normal conducting state. In the preferred embodiment, these resistors are manufactured to be approximately 1,000 ohms using a polysilicon film over a field oxide, which improves their reliability as no P-N junctions are fabricated as part of the resistor 60 facing each device 58 control inputs, which can otherwise fail as a short-circuit to a low impedance power supply potential.

In summary, this method of fabrication of transmission gate 43 serves to maximize the fabrication yield of the overall circuit through the limiting of large, interrupting electrical currents which can otherwise flow as a result of electrical failures within gate 43, and to permit the maximum utility of the other functional portions of the overall circuit in the presence of such failures.

Figure 11:
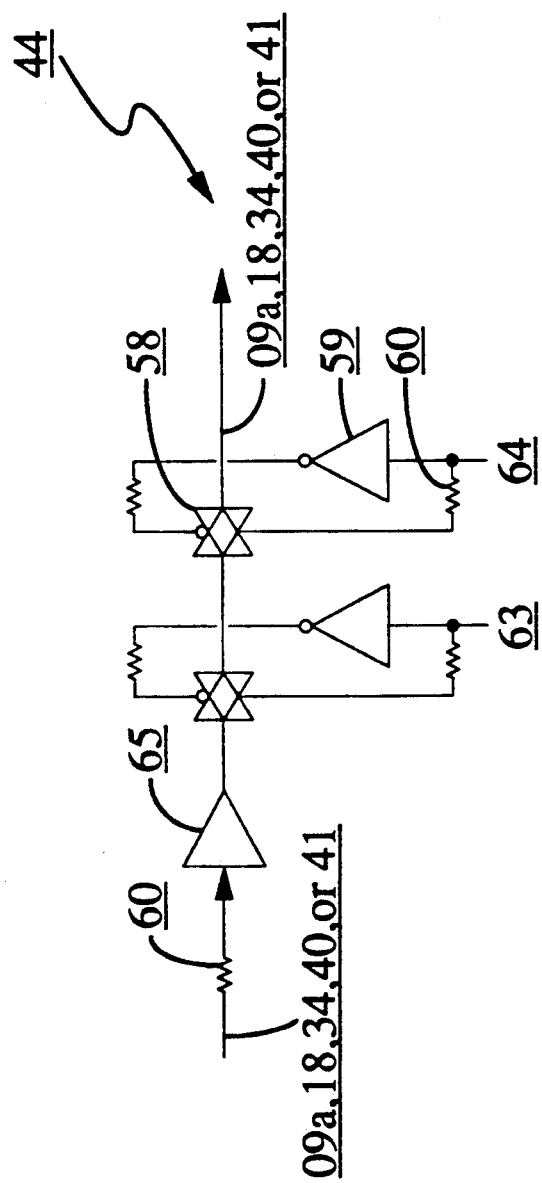
FIG. 11 is a detailed electrical schematic of an amplifier used in all sub-circuit communication ports in accordance with the preferred embodiment of this invention.

FIG. 11 illustrates the detailed electrical schematic for an amplifier, previously identified as 44 in FIGS. 5 and 7, according to the preferred embodiment of this invention. This amplifier is used within amplifier units 13, 13a and 14 as part of processor communication ports 07 and 08. Amplifier 44 is used in pairs everywhere to form bi-directional, tri-state amplifiers (described above for FIGS. 4 and 5) which comprise each of these amplifier units. Each amplifier 44 includes one buffer amplifier 65 which has a resistor 60 connected in series with its input, such that the other side of this resistor becomes the input for the overall amplifier 44. This resistor is used to limit the otherwise high electrical current which can flow due to failures in buffer 65. This input is connected to one of the conductive pathways 09a, 18, 34, 40 or 41, as earlier illustrated by FIGS. 5 and 7. In addition, one output of a second amplifier 44 is connected to each amplifier 44 input, as required to form each bi-directional, tri-state amplifier function. Two transmission gate transistor devices 58 are connected in series, such that each device is controlled by separate enabling signals 63 and 64. This method of fabrication requires that two independent control signals 63 and 64 be provided simultaneously to enable the low-impedance conduction from the output of the buffer amplifier 65 to the output of amplifier 44 which can be connected to a second conductive pathway 09a, 18, 34, 40, or 41, as earlier illustrated by FIGS. 5 and 7. Logic signals 63 and 64 are sent to each amplifier 44 from one of the control logic units 30, 31, or 37, as illustrated in FIGS. 5 and 7. This greatly reduces the probability of failure of amplifier 44 in which its output remains in an uncontrolled conducting mode due to any signal failure by a device contained within amplifier 44 or elsewhere within the overall circuit. In addition, logic inverters 59 provide the necessary complementary signals required to drive each transmission gate transistor device 58. Series resistors 60 are also provided which are chosen to have a value which is small enough to permit the control signals 63 and 64 to reach the control inputs to devices 58 in a maximum allowed amount of time, while these resistors are chosen to be large enough to limit the electrical current in the event of a failure which would otherwise directly connect an input of amplifier 65 or each device 58 to one of the power supply potentials through a very low impedance (e.g., less than 500 ohms), as well as to permit the continuing operation of a transmission gate 43 in a normal conducting state. In the preferred embodiment, these resistors are manufactured to be approximately 1,000 ohms using a polysilicon film over a field oxide, which improves their reliability as no P-N junctions are fabricated as part of the resistor 60 facing amplifier 65 or each device 58 control inputs, which can otherwise fail as a short-circuit to a low impedance power supply potential.

In summary, this method of fabrication of amplifier 44 serves to maximize the fabrication yield of the overall circuit through the limiting of large, interrupting electrical currents which can otherwise flow as a result of electrical failures within this amplifier, and to permit the maximum utility of the other functional portions of the overall circuit in the presence of such failures.

Figure 12:
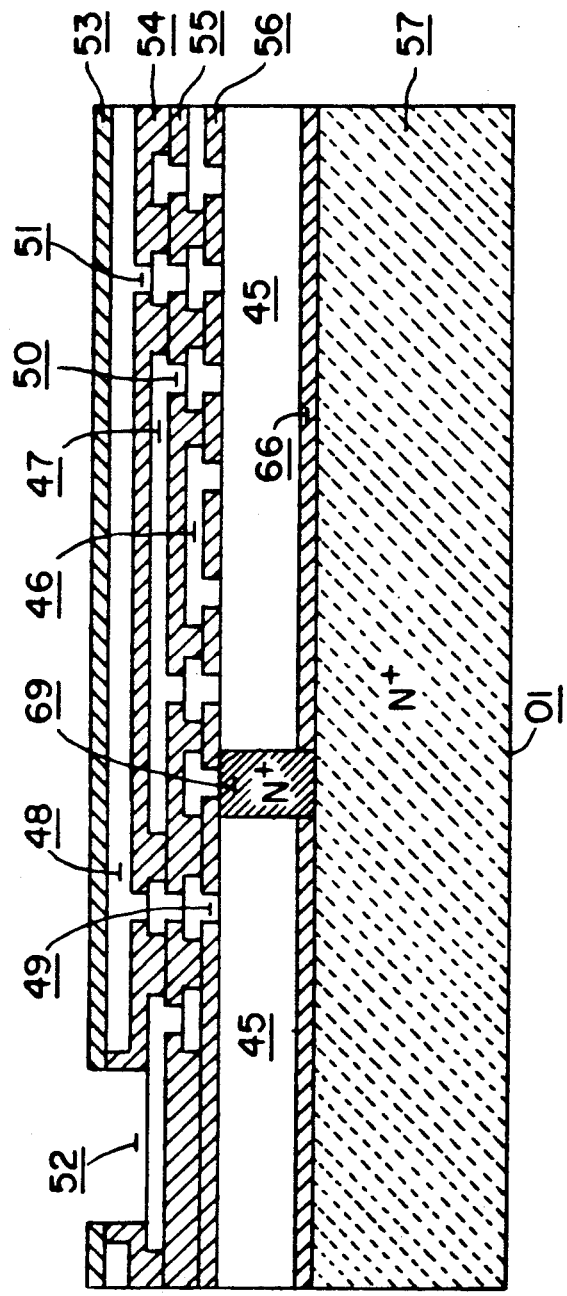
FIG. 12 is a detailed cross-section of a semiconductor wafer fabricated in accordance with the preferred embodiment of this invention.

FIG. 12 illustrates a cross-section of wafer 01 on which an overall circuit is fabricated according to the preferred embodiment of the invention. This cross-section illustrates the interconnect system and wafer substrate relationship used for the distribution of electrical power throughout the overall circuit, as well as for the interconnection of conductive pathways for the various signals which comprise the overall circuit. This interconnect system is composed of three layers 46, 47 and 48, each of which are conductive films, such as metal (Al-Si, Al-Cu, Al-Au) and/or polysilicon (typically N+ with titanium-tungsten silicide shunt). The bottom layer 46 can be either metal or polysilicon and is used for the interconnection of devices together in layer 45 through apertures to the silicon wafer surface. The middle layer 47 is metal or polysilicon and is also used for the interconnection of devices together by way of contacts (or VIAs) 50 to the bottom layer of interconnect 46. The top layer of interconnect, or third layer is a metal film 48 which serves the primary function for the distribution of one of two sources of power to the devices comprising 45 in wafer 01. Connection from this third metallization layer 48 to a device required power in 45 is made by contact (or VIA) 51 to the middle layer of conductive interconnect 47, which, in turn, employs a contact (or VIA) 50 to the bottom layer of conductive interconnect 46, which, in turn, contacts a device in 45 by contact (or VIA) 49. The third (or upper) layer 48 of metallization is made to be mostly contiguous, or un-patterned, over the central areas of each overall circuit, while the only patterning of this layer that is required is to either (1) open bond pads through windows 52, such that one of the two lower conductive films 47 or 46 is exposed for wire-bonding or soldering the overall circuit for the purpose of electrical conductive connection of I/O port 04 signals in regions 05 to a circuit external to the overall circuit, or (2) to be used, only when necessary by layout requirements, as a third-layer of signal pathway interconnection in a small percentage (less than 50%, and typically between 5% and 10%) of the central area of the overall circuit. In the preferred embodiment, this third layer of metallization provides for the lowest possible access resistance from one of the electrical sources of power, applied by wirebond or solder connections at the edges of the overall circuit or wafer 01, and electrically connected to the various devices located in the central regions (e.g., sub-circuits 02 and 03) of the overall circuit. This is a primary concern for the circuit to operate with adequately regulated supply potentials throughout its overall area, as required to achieve a desired logic signal noise margin, as well as to maintain a minimum amount of voltage potential between regions 05 (incorporating windows 52) and the central regions of the overall circuit. This potential is created by electrical current flow along the third layer of interconnect 48 used to deliver this potential to devices in the central regions of the overall circuit. In the preferred embodiment, it is preferred that this upper third layer be as contiguous and as un-patterned as possible, particularly in the central regions of the wafer, such that this third layer is used to deliver a common voltage to a plurality of contacts (or VIAs) 51. It is also preferred that this common voltage be a constant value as much as possible (such as a power supply) so as to act as an electric field boundary condition with respect to the parasitic capacitances coupling through to the lower layers of conductive interconnect 47 and 46, as well as to devices in layer 45. This boundary condition (e.g., metal layer 48 connected to an overall circuit power supply potential) acts to provide predictable coupling capacitances to a non-varying potential, a desirable result in the fabrication of the two lower layers of conductive interconnect as well as matched well terminated transmission lines. Note that insulating oxides 54, 55 and 56 establish a continuum dielectric insulating these transmission lines, while passivation 53 protects the overall surface from surface damage or contamination after it is fabricated. This boundary condition (metal 48 connected to a power supply potential in the preferred embodiment) is established in areas where it has the most benefit, that is, where there are high-speed signals whose transition times are shorter than the time for the signal to electrically propagate over the length of a conductive pathway. This is particularly beneficial in those areas containing communication busses 09.

Wafer 01 is manufactured such that devices in regions 45 can be of any conventional bipolar or MOS technology. In the preferred embodiment, both bipolar and CMOS devices are produced as part of a silicon-on-insulator (SOI) structure, although this is not a necessary requirement for the operation of this invention. This SOI structure incorporates an insulating dielectric 66 which separates the bottom plane of regions 45 everywhere from the top plane of the substrate wafer base region, 57, except at substrate plugs 49. These substrate plugs are fabricated using selective epitaxy such that these regions, when deposited in selectively patterned areas 49, are doped to have a specified semiconductor resistance to electrical current flow which occurs in a vertical direction (with respect to the horizontal surface of the wafer 01). This resistance is set to be such a value to be low enough to provide the required current flow to operate the devices in regions 45 to which substrate plug 49 is electrically connected to by way of interconnect layers 46 and/or 47, while high enough in resistance to not impair the operation of the other portions of the overall circuit should an electrical defect occur which acts to electrically short the top surface of substrate plug 49 to any other neighboring structure of wafer 01. The bottom surface of substrate plug 49 is made to be electrically contiguous with the lower substrate wafer region 57, which is also doped to be highly electrically conductive. This region 57 is fabricated to act as a conductive boundary condition to electric fields with respect to devices comprising regions 45 and to conductive layers 46 and 47. This substrate region 57 is also utilized to distribute electrical power to the bottom planes of substrate of plugs 49 in a similar manner as does the third layer of metallization 48 with respect to its contacts 51. Typical values for the resistance of substrate plug (in a vertical direction) 49 is between 300 ohms and 500 ohms, and the bulk resistivity of lower substrate wafer region 57 is between 0.005 ohm-centimeter and 0.1 ohm-centimeter.

The fabrication of the interconnect system described above in the preferred embodiment enables very large circuits (approximately 767,000,000 transistors in the preferred embodiment) to be produced while maintaining a very low probability (less than 1%) that any single fabrication defect will cause a low-impedance (less than 300 ohms) electrical failure in which the power supply distribution layers (metallization layer 48 and lower substrate region 57) are directly shorted together. This system also provides for electrical boundary conditions above and below the active devices 45 and interconnect pathways 46 and 47 which serves to improve the transmission line characteristics for long pathways.

Figure 13:
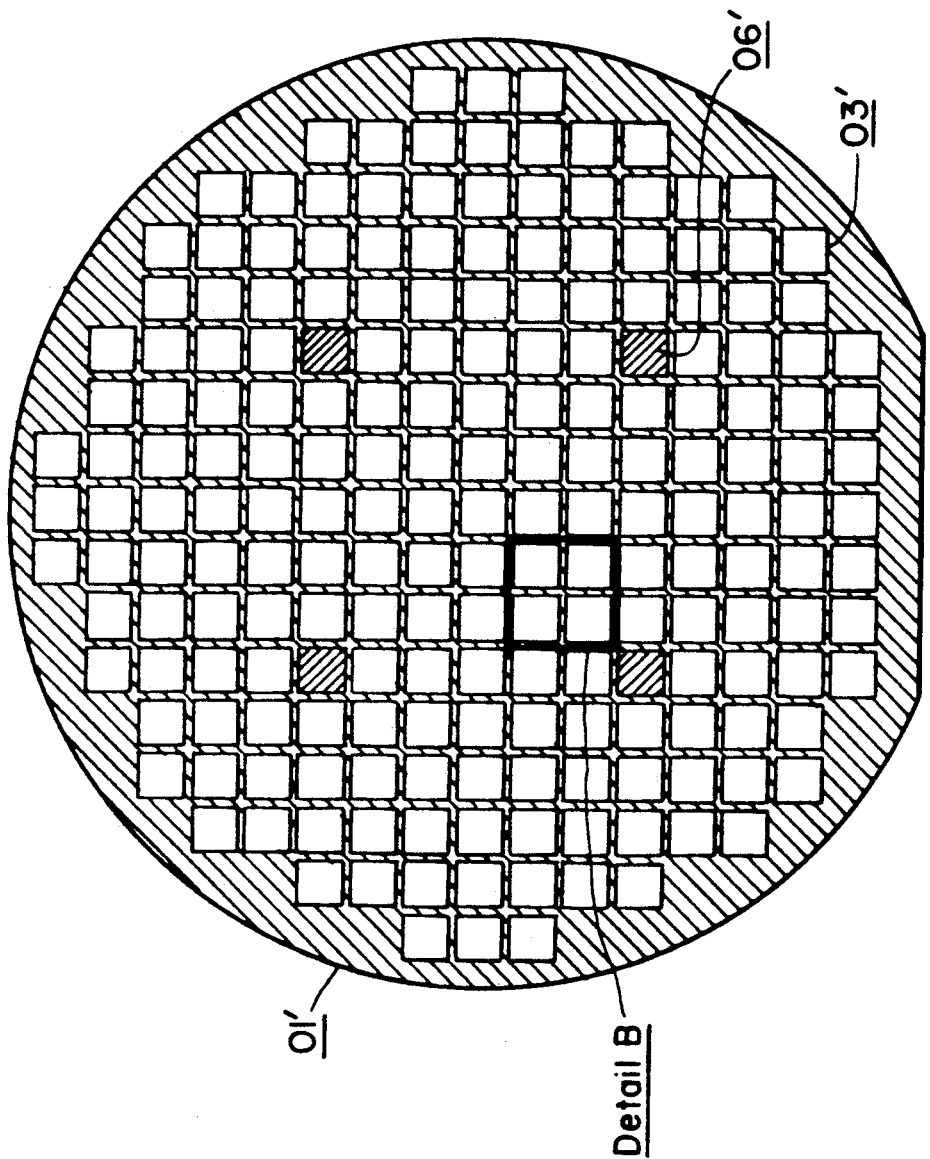
FIG. 13 is a diagram of a semiconductor wafer whose physical organization and layout is in accordance with the prior art.

FIG. 13 illustrates a wafer 01' fabricated according to the prior art. A plurality of circuits 03' are patterned to occupy most of L the available surface area of wafer 01'. In the cases where these circuits include more than 100,000 transistors, the prior art regarding microelectronic fabrication methods requires the use of an electrical test system to probe each circuit 03' to establish its functionality, followed by (a) placing an ink dot on the circuit if it tests defective, (b) optional testing redundant areas on the circuit for functionality, then electrically programming each circuit to function, or (c) optional testing redundant areas for functionality, followed by further wafer fabrication to form a custom pattern which serves to interconnect only the functional areas on each circuit together. Process control monitor patterns 06' are included to provide for verification of various control parameters regarding the fabrication of wafer 01'.

Figure 14:
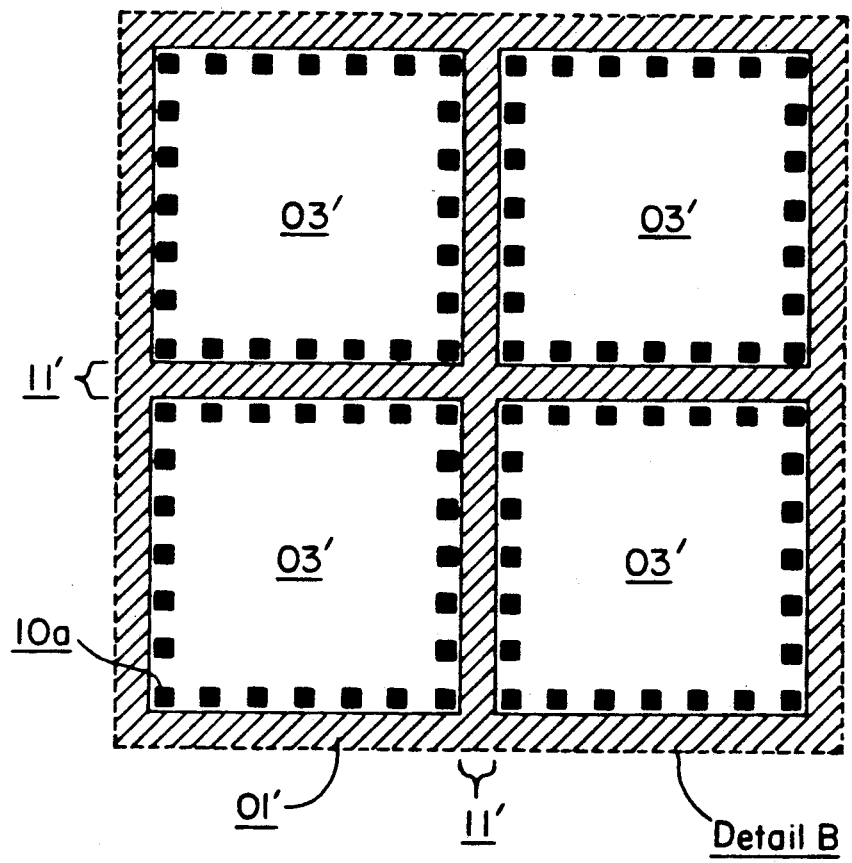
FIG. 14 is a diagram for the individual circuits which are patterned on the semiconductor wafer typically manufactured according to the prior art.

FIG. 14 is an illustration for Detail B from FIG. 13 for the circuits 03' made according to prior art methods. Each circuit contains within its boundaries bonding pads 10' as required to both perform wafer probing as described above as well as wirebonding or soldering of the circuit die for the purpose of its electrical connection to other circuits and systems. Dicing (or sawing) pathways 11' are placed between the orthogonal boundaries of the neighboring circuits 03' or between circuits 03' and process control monitors 06'. According to the prior art, these pathways are designed for the purpose of providing a region for scribing and/or sawing of the wafer 01' into separate circuit die 03' and 06'. These dicing pathways 11' do not contain any type of electronic circuit which is intended to operate after the wafer 01' is diced or sawed into individual monolithic die.

The differences between this invention and prior art methods are, inter alia:

(1) Prior art methods for circuit fabrication and operation do not employ a self learning method coupled with an organization or layout for the purpose of identifying its own electrical failures, then followed by the dynamic re-configuring of its redundant elements resulting in an improve yield probability that each overall circuit will be useful.

(2) Prior art methods utilize other electrical test systems to probe each wafer when circuits are large, such as to identify or otherwise re-configure the circuit to be useful. This new method enables the full electrical test and verification of each circuit by itself, such that virtually every circuit will become useful and the need to perform this wafer probe test no longer exist.

COMPUTER SIMULATED EXAMPLE

A semiconductor wafer has been developed in accordance with the invention by computer simulation. Such a circuit is presently under construction for the purpose of producing a single monolithic computer system employing a scalar instruction set and whose operating time base is set to 200 MHz. Microelectronics are formed which collectively follow an architecture in accordance with the principles of this invention. This example demonstrates a statistical yield probability for functionality of approximately 92.7% for a single-wafer microelectronic computer comprising an average of 767,056,728 transistors within its useful regions, fabricated contiguously as one circuit on a 125 mm diameter silicon wafer. This wafer structure follows the preferred embodiment, and incorporates the following specialized microelectronic sub-circuits, each of which is patterned in a plurality of places on each wafer, as follows:

(1) Processor: Contained within each processor sub-circuit 02 is a high-speed, 32-bit data-word processor unit 02a using a custom instruction set, 27 address lines, and 11 control lines. This processor unit is patterned to occupy approximately 14.6 mm$^2$, or about 70%, of a rectangular area for the sub-circuit whose size is 4.60 mm by 4.55 mm. This sub-circuit is redundantly patterned four times on each wafer. Contained within each processor is 65,536 bits of random access memory (RAM), of which 47,808 bits are allocated for use by the processor in recording selected addresses representing the functional portions of memory on the wafer. The control processor operates to address a portion of its internal random access memory (RAM) for the purpose of dynamically substituting the leading address bits for a known functional memory space, or "block", in place of a leading address bits for a known defective memory space, or "block", each time the processor sends an address out to the remaining memory (within the other sub-circuits) when executing software requiring the use of contiguous memory address spaces. Therefore, this control processor RAM functions, in part, to provide for the real-time translation of the set of contiguous electronic addresses (required to execute most software) into a non-contiguous set of addresses which read from, or write to, only functional memory bit storage cells, grouped in these "blocks", existing on the wafer. By this method, present-day software can be made to be compatible with any non-contiguous memory address space as long as there is enough processor RAM available to translate the addresses to all possible combinations of defective "blocks" within the fabricated memory sub-circuits on the wafer, and that there are not so many defects on the wafer that all blocks are defective in this implementation. The processor memory size is set to be equal to the total number of bits fabricated on the wafer multiplied by the total number of bits needed to address the number of memory blocks, then divided by the number of bits within each block. In this example, there are 498 memory sub-circuits produced on this wafer, each with 262,144 memory bits, for a total of 130,547,712 bits fabricated per wafer. With a memory block size of 32,768 bits, there exists 3,984 blocks, all of which require a 12 bit word to address any of these blocks. Note that the number of bits in each block must be equal to a multiple of integral powers of 2 (e.g., 2,4,8,16,32, etc.), as blocks of other sizes will inherently leave sections of a binary-addressable address space open or as non-contiguous. In practice, an advantage in the use of binary addressing is that it also minimizes the number of address lines needed for a given number of bits in memory. This consideration directly affects the percentage of the overall circuit area used to fabricate the communication busses, to be minimized as desired to achieve highest fabrication yield of the overall circuit. Also note that if the block size is set to be too small, the processor RAM requirement becomes so large that the resulting physical size of the processor minimizes its sub-circuit yield, therefore reducing the yield probability for the electrical functionality of at least one of the four redundant processors as required for this invention to operate. On the other hand, if the block size is set to be too large, then the occurrence of each defect on the wafer causes the removal of a large amount of fabricated memory from electrical operation, again reducing the yield for useful memory by this invention. Therefore, this block size is chosen to be an optimum value based on the total memory fabricated within a the overall circuit and the rate of occurrence of defects within that format; this is typically characterized by those skilled in the art as a density parameter in units of defects per square centimeter for the wafer fabrication process employed. Given the 130.55 MBits on this 125 mm wafer, and wafer defect densities (described in Paragraph 7 below) established for wafer fabrication regarding the preferred embodiment, this defines a processor memory equal to 47,808 bits to perform this translation with highest overall circuit yield while providing for complete coverage of the memory on the wafer. Also note that this translation is accomplished each time a data word is sent out from, or brought into, the control processor with a minimum of delay introduced into the timing of these data signals.

Photolithically programmed in 65 536 bits of read-only memory (ROM), also included within each processor area, is the algorithm of FIG. 9 which performs the following tasks: self-testing of each processor; search and identification for other working processors on the wafer; search and identification of non-functional segmented communication busses; sequential re-configuring of the segmented communications busses according to an algorithm which electronically disables the non-functional communication busses and electronically enables the fully functional busses; functional testing of the memory sub-circuits 03 by way of the functional communication busses, identification and recording of the addresses for the non-functional memory blocks within the memory sub-circuits; identification of the functional I/O ports comprising each I/O port sub-circuit 04 on the wafer; and the sending of a system status word to these functional I/O ports once the aforementioned tasks are periodically executed. This system status word is read by redundant external electronic circuitry for the purpose of verifying the integrity of the overall circuit on each wafer once this algorithm has been completed. This status word reports the available memory capacity configured to function on each wafer, which processor sites are functional, which of the I/O ports are functional, and whether or not any changes in the configuration of the wafer has occurred.

Also, photolithically programmed within each processor sub-circuit area are individual priority codes which are each 4 bits in size. Each of these processors includes an oscillator which is used to establish a time base for operation of each overall circuit. Clock speeds for each processor are set at 200 MHz±30% as permitted by the high operating memory bandwidth achieved through minimization of coupling capacitances to the communication busses by this wafer format. Also included within the remainder of each processor sub-circuit area are two communication ports 07, which enable the processor to communicate directly with two segmented communication busses 09, which collectively occupy approximately 3.34 mm², or about 16%, of the processor sub-circuit area. These communication ports are placed along two of the peripheral sides of the processor unit 02a or 02a' which are orthogonal to each other.

(2) Memory: Contained within each memory sub-circuit 03, redundantly patterned 498 times on the wafer, is a high-speed memory unit 03a which is based on a six-transistor, silicon on insulator static random access memory (SRAM), preferably of the type shown and described in a co-pending U.S. patent application, Ser. No. 07/458,590, filed Dec. 29, 1989. Unit cell size for each six-transistor bit storage cell is is 57.6 μm2, and a CMOS process technology having 1.0 μm surface minimum feature sizes is used. A 0.75 μm effective channel length for the NMOS devices and a 0.9 μm effective channel length for the PMOS devices are employed in conventional CMOS transistor fabrication. Each of these memory sub-circuits comprises 262,144 bit storage cells, is organized in a 512 by 512 format and occupies about 15.1 mm², or about 72%, of the area within each of these sub-circuits. Each memory sub-circuit is also patterned to be 4.60 mm by 4.55 mm in overall size. Two segmented communication busses 09 and two communication ports 08 also occupy 3.34 mm², or about 16%, of the remaining area within the boundaries of each memory sub-circuit. Each of these two communication busses are positioned so that they are on two orthogonal sides of the memory unit 03a, and such that when each memory sub-circuit is patterned by the use of an optical stepper (e.g., a GCA model 4800), all of the interconnect pathways within each buss meet in a contiguous manner with busses in other sub-circuits as necessary to form a useful overall circuit on the wafer. The communication ports contain a plurality of amplifiers, used for the purpose of communicating signals among all sub-circuits, which sense at their inputs individual voltage signals on the various conductive pathways comprising these busses. These amplifiers then pass replicas of these signals into memory (as well as to other) sub-circuits under the control of logic contained within each communication port. These amplifiers also have circuitry which acts to output voltage signals which are electrically and logically replicas of these input voltages. These amplifier outputs either have a low "on" resistance of less than 600 ohms, or this circuitry acts to become high-impedance (approximately 5,685 ohms) with regard to the pathways to which these amplifier outputs are connected. These amplifiers are used in an identical manner in communication ports located in other processor and I/O port sub-circuits described elsewhere in this example. A memory sub-circuit communication port includes a 128-bit storage register which records a memory sub-circuit port instruction, periodically sent by one of the processor sub-circuits to each communication port. This instruction is then decoded by logic included within each communication port to configure and control the subsequent electrical operation of each pair of amplifiers to function as one bi-directional, tri-state amplifier, which is connected to one end of each conductive pathway comprising the communication busses. This port control instruction also contains a 9-bit word (in the preferred embodiment) which is sequentially established by the control processor each time it determines that a memory sub-circuit is functional through the communication busses, such that this 9 bit word, stored at control logic 32 within each memory sub-circuit, controls when each memory sub-circuit has data written to/ or read from, the control processor In effect, these 9 bits control the "position" of each functional memory sub-circuit within the control processor's address space. Also included within each memory sub-circuit is a 27-bit address decoder unit, a 32-bit parallel bit-line memory sense amplifier unit, and a 512-line write driver unit which are of conventional design as understood by those skilled in the art of electronic memory design. Preferably, this memory sub-circuit is optimized for minimum surface area as it is patterned over a majority of the area of the wafer. The processor sub-circuits 02 are patterned to fit within the same physical size as the memory sub-circuits such that the conductive pathways 09a, which make up the communication busses from sub-circuits of all types, meet to become contiguous between neighboring sub-circuits with a minimal use of area on the wafer. This method for photolithic patterning of each sub-circuit on the wafer is compatible with the use of an optical stepper in wafer fabrication.

(3) I/O Port: An I/O port sub-circuit 04, redundantly patterned in six locations on the wafer, each functions to provide two redundant, 89-bit parallel, electronic input-/output (I/O) interface units for handling signals to/-/from the overall circuit. These 12 redundant interface units are each positioned close to the physical edges of the wafer. Each I/O inteface unit includes: 32-bits for the data word which is communicated in a bi-directional nature (defined here as being either an input, output, or an inactive condition), 27 bits for system memory address use (inputs to the overall circuit) 11 processor sub-circuit control lines (6 outputs, 5 inputs from/to the overall circuit, respectively), 6 bits for output of the system status word from the overall circuit, and 3 bits as inputs for interrupt control of the processors fabricated on the wafer. All communication to/from the overall circuit on the wafer passes through one of these I/O interface units which are controlled by either one of the processor sub-circuits or by a circuit external to the wafer. Pathways from each of the two redundant I/O interface units are electrically connected to one set of 89 bond pads located within in each bonding area 05 patterned in six places near the edges of the wafer, and next to each I/O port sub-circuit 04. There are 89 bond wires required to electrically connect both I/O interface units within each I/O port 04 to external interface circuitry. There are 8 additional bonds required for applying electrical power at each bonding area 05 which is electrically distribute to the various sub-circuits within the overall circuit on the wafer.

(4) Wafer: A silicon-on-insulator (SOI) base wafer 01 is preferably employed in the fabrication of the overall circuit. This structure reduces the probability for the occurrence of certain defects which result in large electrical currents which pass from a defective circuit (on the wafer frontside) to the wafer backside, which can cause common-mode failures which render the overall circuit useless. The use of SOI wafer technology is preferred as it provides for a virtually fail-safe structure, given the statistics for the types of wafer surface defects which are possible. In specific no surface defect can cause a power-supply short-circuit anywhere in the wafer unless such a defect were to penetrate the wafer surface through the buried oxide layer (not likely anywhere on the wafer, unless the wafer is deeply scratched, e.g., a mis-handling operation), and that this surface defect simultaneously and electrically bypasses any of the plurality of current-limiting resistive plugs 49 used for distribution of one of the supply potentials, electrically connected to the wafer backside (in this case, between 3.5 and 5.5 volts) to the top (e.g., third) layer of metallization used for distribution of the other power supply potential (in this case, ground) This invention will also function without the use of an SOI wafer format; however, certain surface defects can then cause high currents to flow between neighboring surface structures directly connected to opposite power distribution pathways, electrically connected to different voltages, due to the smaller resistances which characterize these failures than is the resistance of each plug 49. In a non-SOI wafer format, these power distribution pathways should be positioned as far apart as possible, and surface resistances (e.g., polysilicon resistors on field oxide) be placed in series with all power distribution points, so that a limiting of current through any credible failure can be achieved as in the preferred SOI wafer example above, as required to maximize the ability of the remaining circuitry to operate in the presence of such failures.

Power distribution voltage drops are minimized (to approximately 117 millivolts throughout the wafer) as a result of the implementation of the following two electronic concepts:

(A) The wafer backside is heavily doped to become conductive (nominally at 0.08 ohm-cm) for the purpose of supplying one of the two power distribution pathways required to electrically power the circuit, by way of plugs 49 in a plurality of locations throughout each sub-circuit on the wafer. These plugs and wafer backside distribute the positive voltage "Vdd" lines, which are set to be between 3.5 to 5.5 volts by the external application of this voltage. In addition, the wafer backside is conductively attached to a gold conductive film on an alumina substrate, which serves to equalize the voltage potential; across the backside of the wafer. Circuit ground potential (zero volts) is distributed by a third metallization layer, which is deposited (in wafer fabrication) and not patterned on the wafer except for open areas around the bond pads near the edges of the wafer. Therefore the third metal layer covers the entire central region of the wafer without having any open or patterned areas in this metal layer. This "ground plane" provides circuit ground connections through a plurality of openings in an insulating dielectric throughout each sub-circuit, which pass currents at ground potential to the central sub-circuits on the wafer. This results in a lowest possible access resistance to distribute electrical power to all sub-circuits on the wafer, and forms a useful electric field boundary condition for the purpose of minimizing the effect of stray capacitances which couple neighboring devices and elements on the surface of the wafer.

(B) The use of a six-transistor memory bit cell construction minimizes the static currents which flow through each of the memory sub-circuits. such that the remaining currents that flow in these sub-circuits are those required to charge the various device and interconnect capacitances on the wafer due to time-varying excitation, sub-threshold leakages, and P-N junction leakages. Hot-electron collection effects in the substrate underlying these memory structures, a problem in many other conventional microelectronic memories, is also reduced by the presence of a buried oxide layer 66 as a result of the use of a silicon-on-insulator substrate base wafer.

(5) Power Consumption: Overall power consumption, using a nominal 200 MHz clock speed for defining read/write memory access and instruction cycle times, is between 48 and 78 watts of power for the overall circuit. A budget of 10 watts of power is allocated to the four controlling processor circuits, which use current-mode MOS or bipolar logic and require a continuous current flow which does not change by more than 20% in any mode operation. Between 23.2 and 46.4 watts of power is allocated to supply the currents required to drive the interconnect capacitances for all of the conductive pathways which make up the communications busses and communications ports. This is an important consideration as the AC signal activity of these pathways is equivalent to each conductive pathway being driven at 200 MHz at between 20% and 40% of the time, which follows from (a) the sum of the capacitances for each of the 70 pathways which make-up the 1,024 segmented communication pathways is approximately 48.4 nano-farads, (b) the peak-to-peak signals on these pathways is set to 1.2 volts, and (c) the nominal power supply is operated at 5.0 volts. Approximately 15 watts of power is budgeted to drive all of the memory and I/O port sub-circuit logic, most of which is consumed by memory address decoders, core pull-up circuits bit storage cell write drivers, and interface circuitry which is electrically connected to external circuits to the wafer. Note that since the overall circuit operates synchronously under the control of one of the processors, only one set of bit-lines within all of the operational memory blocks is being accessed or written to at a time. Therefore, a very small percentage of the functional memory is characterized by requiring time-varying signals. This greatly reduces overall AC-related power-supply currents otherwise required by alternative memory architectures (e.g., a 4T SRAM or any DRAM structure) which is equivalent to the memory capacity given in this example. The last source of power consumption for the overall circuit is sub-threshold and P-N junction leakage currents. Regarding the approximate 790,271,200 transistors which are collectively fabricated in all of the circuits on the wafer, an average of 130,000,000 CMOS transistors, not used in current-mode logic required in the processors, will contribute to these leakages because they have a continuous bias voltage applied to them and are intended to have zero current passing through them. A maximum current of 10 nano-amperes per transistor has been measured for these leakages (in multiple transistor test arrays), and is typically one to two orders of magnitude less. Therefore, these leakage currents can result in a predicted maximum 6.5 watts of additional power consumption for the 125 mm wafer manufactured with the aforementioned 0.75 $\mu$m (effective channel length) CMOS process.

(6) Fabrication: The fabrication of these wafers utilize a GCA model 4800 optical stepper for the purpose of patterning 14 reticles which make up each of the processor 02, memory 03, and I/O port 04 sub-circuits. The processor circuits 02 are patterned 4 times near the center of the wafer. Note that all reticles are identical except for the second layer of metallization, which was individually modified and then patterned for each processor 02 so that the priority codes (in a small 4-bit memory) are sequentially established. Each processor 02 comprises about 90,000 transistors and is 4.60 mm by 4.55 mm in size (including the two orthogonal communications busses 09). The memory sub-circuits 03, each comprising 262,144 bits, are also patterned by optical stepping; 14 reticles are utilized in each of 498 sites which occupies a majority of the surface area of the 125 mm diameter wafer. These reticles also include two communications busses 09 within their 4 60 mm by 4.55 mm area. Six I/O ports 04, each of which has two redundant, 89-bit parallel, I/O port interface circuit units in this embodiment, are collectively patterned in six places near the edges of the wafer through the use of an optical stepper as well. Overall production costs for this wafer are increased by between $100.00 and $350.00 by the use of this stepping method for patterning the wafer in accordance with the preferred embodiment of this invention, when compared with the cost of stepping one set of 14 reticles across the wafer as is done in conventional wafer fabrication for a 256K static random access memory.

The completed 125 mm wafer is mounted to a square alumina substrate which is 150 mm by 150 mm in size, 96% A1203 in composition, and which has a thermal coefficient of expansion that is within 10% of the silicon wafer 01. Single-part, silver-loaded epoxy adhesive film, buffered by an elastomeric media, is used to attach the wafer to this alumina substrate to minimize out-gassing during curing, and a 0.001 inch thick gold conductive thick film metallization is employed on the alumina substrate to make electrically conductive contact to the wafer backside as well as to provide for the interconnection of 97 wire-bonds to the wafer surface at each of six locations along the edges of the wafer. These locations are electrically connected to gold-nickel plated Kovar pins by way of this gold conductive film as part of a custom-manufactured, 6-inch square, metal tub enclosure having 642 pins in which the alumina substrate, to which the overall circuit on wafer 01 is mounted, is contained or housed.

(7) Overall Circuit Yield: Briefly reviewed below are the principles regarding conventional circuit yield statistics, followed by a review of the method by which the architecture described above (defining the physical layout of the sub-circuits on the wafer) is combined with the processor's ROM-based test and configuration algorithm to provide for a significant improvement in overall circuit yield statistics in accordance with the preferred embodiment of this invention.

In theory, the probability of yield for functional circuits on a wafer can be modelled by the following relationships:

Eq (1): $P1 = [[1 - e^{-(DoxA)}]/(DoxA)]^2$    Murphy

Eq (2): $P2 = e^{-\sqrt{(DoxA)}}$    Seeds

Eq (3): $P3 = P3 = 1/(1 + SxDoxA)^{(1/S)}$    Gamma where $0 < S \leq 1$    Function where P1, P2 and P3 are the probability densities for each model (between 0 and 1), Do is the density of defects per square centimeter for the fabrication process employed, A is the area of the circuit in square centimeters applicable to these defects, and S is a shaping parameter which is applicable only with the use of the Gamma function.

The probability that a given circuit will be functional is commonly modelled by Eq. 1 (Murphy) when the predicted yields are higher than about 34%, and by Eq. 2 (Seeds) when these yields are less than about 34%. For a given Do, there exists an area A where both Eqs. 1 & 2 will predict an identical yield probability (at approximately 34% ) for a functional circuit. It has been historically established that the yield equation according to Eq. 1 (Murphy) is most accurate for small circuits yielding greater than 34%, while the Seeds formula is most accurate when yields fall well below 34%. The Gamma function Eq. 3 is used in cases where both Do and S are known for the wafer fabrication process employed. The advantage of the Gamma model is that it provides for a continuous rate of change, with better accuracy than the Murphy and Seeds models, for predicting yield probabilities around 34%, while maintaining acceptable accuracy in the cases for very high and very low yielding circuits. This use of the Murphy and Seeds models collectively results in a small discontinuity at about 34%; and therefore, these models are less accurate when calculating probability yields of about 34%.

In this example, characterization data for the shaping parameter S was not available regarding the wafer fabrication process being used. Therefore, the yield formulas according to Murphy & Seeds models are uniformly applied throughout the following analysis. Characteristic defect densities are known for the CMOS fabrication process being used, when applied to fabricate three types of circuit structures: (1) Do=0.256 defects/$cm^2$, for two layers interconnect patterns with feature sizes and spacing between 5 μm and 10 μm] this parameter is referred to as D1 in the subsequent analysis and is applicable to areas containing communication busses, (2) Do=1.024 defects/cm2, for areas containing two layers of interconnect patterns with feature sizes and spacing between 2.5 μm and 5.0 μm; this parameter is referred to as D2 in the subsequent analysis and is applicable to areas containing regions having lithograpy in each of the sub-circuits, and (3) Do=3.072 defects/cm2, for active transistor circuitry on the wafer (excluding the interconnect layers) with feature sizes and spacing between 1 μm and 3 μm; this parameter is referred to as D3 in the subsequent analysis and is applicable to areas containing active devices and P-N junctions which are impacted by defects in the crystal, in addition to defects in lithography as identified above.

Table 1 below summarizes the physical size and yield statistics for the sub-circuits based on using the Murphy & Seeds models described above. Presented are the active and overall areas which make up each sub-circuit, to which the respective defect densities D1, D2, and D3 given above are applied in the various yield calculations. Yield probabilities in lines 9 through 12 below are calculated from:

Eq. 4:
$$P4 = P(\text{active transistor}) \times P(\text{small interconnect}) \times P(\text{large interconnect})$$

This is equal to the product of the separate probabilities for functionality of the active transistor ares calculated with the D3 parameter, the functionality for small (2.5 μm-5.0 μm) interconnect calculated with the D2 parameter, and the functionality for large (5.0 μm-10 μm) interconnect calculated with the D1 parameter. Each of the yield probabilities in lines 9 through 11 are identical to those yields expected in conventional wafer fabrication as through these processors, memories, and I/O ports were each produced on a wafer at a time, then tested and diced from the wafer. Line 12 yield is conveniently given separately as this communication buss yield is used in several subsequent calculations. For example, the yield for a memory sub-circuit is modelled by calculating the product of line 10 and line 12a below, where line 12a is calculated from line 12 on the basis that failures require non-functionality of both communication busses at the same time. Note that the processor sub-circuit yield is slightly higher than that of the memory sub-circuit, primarily due to the difference in their active transistor areas.

TABLE I

| | Sub-circuit Sizing and Yield Parameters, 125 mm Diameter Wafer | |
|---|---|---|
| 1. | Sub-circuit "X" Size: Each Processor, Memory and I/O Port | 4.60 mm |
| 2. | Sub-circuit "Y" Size: Each Processor, Memory and I/O Port | 4.55 mm |
| 3. | Overall Area of Each Sub-circuit with Busses | 20.9 mm² |
| 4. | Number of Complete Sub-circuits per Wafer | 508 sub-crkts |
| 5. | Active Area in Each Processor Sub-circuit | 14.6 mm² |
| 6. | Active Area in Each Memory Sub-circuit | 15.1 mm² |
| 7. | Active Area in Each I/O Port, Two per Sub-circuit | 8.4 mm² |
| 8. | Segmented Communication Buss Area in Sub-circuit | 3.34 mm² |
| 9. | Probability for Each Processor to be Functional | 52.6 percent |
| 10. | Probability for Each 256K Memory to be Functional | 51.9 percent |

TABLE I-continued

| | Sub-circuit Sizing and Yield Parameters, 125 mm Diameter Wafer | |
|---|---|---|
| 11. | Probability for a Minimum of One of Two I/O Ports to be Functional within I/O Port Sub-circuit | 91.0 percent |
| 12. | Probability for Each Segmented Communication Buss to be Functional | 99.1 percent |
| 12a. | Probability for a Minimum of One of Two Segmented Communication Busses to be Functional | 99.992 percent |

Probabilities in lines 9–12 above were calculated by using the the Murphy model as they are each greater than 34%. If only processors of the same size are produced on a wafer which is patterned in accordance with the prior art (see FIGS. 13 and 14), and that the fabrication process employed is the same as characterized above, then prior art methods result in an average of 267 whole functional die (this is 52.6% of the 508 whole sites available) per wafer. Likewise, a yield of 263 whole functional memory die per wafer would occur if made with this fabrication process according to the prior art. This latter prior art yield is equivalent to retrieving an average of 68,943,872 bits of functional memory per wafer. This is approximately 58.1% of the memory which is made to be functional by this new method of the invention, as detailed below. This new method implements at least one of a multiple of special processors fabricated together on the same wafer as the memory, made to operated together as one large circuit. In this example, only one of these processors must be functional in order to perform the functions described by the embodiment of this invention. These functions, as previously noted, are to identify malfunctioning sub-circuits (in this case, memory and I/O ports) as well as communications busses, followed by their collective re-configuration into a fully functional circuit. The probability for an overall circuit to be functional according to this method is conservatively modelled by:

Eq. 5:
$$P5 = [1-(1-P(\text{processor}))A] \times [1-(1-P(I/O\ \text{port}))B] \times P(\text{communication buss and communication port})C$$

where P(processor) is each processor sub-circuit yield, P(I/O port) is each I/O port sub-circuit yield (each containing two redundant I/O port interface circuits, only one of which must function for the overall circuit to function). P(communication buss and communication port) is the yield for each of the segmented communication busses and communication ports. In addition, A is the number of redundant processor sub-circuits, B is the number of I/O port sub-circuits, and C is the minimum number of individual segmented communication busses and communication ports which must collectively function between processors in order for any of the processors to be functional, as determined by the layout of sub-circuits on the wafer. In the physical layout and architecture of this example, A=4, B=6, and C=4, which results in an approximate yield of 92.7% for an overall circuit which occupies the wafer. For those overall circuits that are functional, the embodiment of this invention enables the controlling processor to configure an average of 118,685,696 bits, or 90.91%, of memory storage capacity from the available 130,547,712 bits fabricated on the wafer. Calculations for this functional memory capacity is by the following formula:

Eq. 6:
M(functional) = M(sub-circuit) × Y1 − M(block-) × Y2 where M(functional) is the average number of data bits of functional memory in the overall circuit, M(sub-circuit) is the number of data bits fabricated within each memory sub-circuit, Y1 is the average number of memory sub-circuits which are accessible by the functional communication busses and communication ports by the control processor, M(block) is the number of bits, set by the processor's test algorithm, for each memory block, and Y2 is the average number of fabrication defects which will cause an electrical failure within a memory block.

Table 2 below summarizes these yield and memory configuration statistics for this example. In this case, M(sub-circuit) is 262,144 bits as the memory sub-circuit size. Y1 averages 490 of the available 498 memory sub-circuits on the wafer, which is primarily dependent on the density of defects in the communication busses and communication ports as well as on the coverage possible by the search, identify, and re-configuration algorithm by the processor (see FIG. 9). Note that, in this example, an average of 8 communication busses will be electrically defective of the 1,024 busses comprising the overall circuit on the wafer. Y2 averages 298 as this is the number of defects which occur in the interconnect and transistor areas contained within the successfully configured memory sub-circuits on the wafer, and M(block) is set to 32,768 bits in this implementation of the preferred L embodiment. As described above regarding the processor design, 47,808 bits of memory are required in the processor to store a maximum of 3,984 block jump addresses, which are 12 bits in size and are the most significant 12 bits of the total of 27 bits required to address all of the memory fabricated on the wafer (130.55 M-bits).

It is significant to note that, by this method, when the wafer fabrication defect density in the memory sub-circuits increases by a factor of two over those values given above, then the available memory configured by this algorithm reduces to 104,923,136 bits, which is a reduction of 11.6%. When compared to the prior art methods, the same SRAM memory die (fabricated, of course, without the communications pathways and ports necessary to implement this invention) would yield an average of 28.1% (calculated by the Seeds model) of the whole die per wafer, or 142 memory die per wafer. This results in an average of 37,224,448 bits of memory which yield into useful circuits per wafer, which is a reduction of 46.0% from the earlier prior art example reviewed above. Therefore, this new method enables very large circuits (such as memory) to be fabricated with yield statistics which are much less dependent on the density of defects in wafer fabrication, which is a desirable result following the implementation of this invention.

TABLE II

| Revised Wafer Yield Statistics According to Invention | |
|---|---|
| 13. Number of Redundant Processors on Wafer (Each with a Different Priority Code) | 4 sub-crkts |
| 14. Probability for a Minimum of One Processor to be Functional | 94.9 percent |
| 15. Number of I/O Port Sub-circuits on Wafer Each Sub-circuit Having Two Redundant I/O Ports | 6 sub-crkts |
| 16. Probability for a Minimum of One I/O Port to be Functional | 99.99 percent |
| 17. Number of Memory Sub-circuits Fabricated on Wafer | 498 sub-crkts |
| 18. Total Fabricated Memory Capacity on Wafer | 130.55 M-bits |
| 19. Number of Segmented Communication Busses on Wafer | 1,024 busses |
| 20. Number of Segmented Communication Busses between Each Pair of Processors | 4 busses |
| 21. Average Number of Busses through which Any Processor Must Communicate with Sub-circuits at Edges of Wafer | 16 busses |
| 22. Average Defects/Wafer in Active Transistor Circuitry within Configured Memory Sub-circuits | 227 defects |
| 23. Average Defects/Wafer in Photolithically Patterned Areas within Configured Memory Sub-circuits | 71 defects |
| 24. Average Defects/Wafer in All Communication Busses (Busses Having these Defects are Disabled by Processor) | 8 defects |
| 25. Average Number of Memory Sub-circuits Successfully Configured by Two-Pass XY Processor Algorithm | 490 sub-crkts |
| 26. Optimal Memory Block Size Used by Algorithm | 32,768 bits |
| 27. Average Number of Memory Blocks Configured | 3,920 blocks |
| 28. Average Number of Memory Blocks to be Defective | 298 blocks |
| 29. Average Number of Memory Blocks to be Functional | 3,622 blocks |
| 30. Processor RAM Required for Defect Address Table | 47,808 bits |
| 31. Average Configured Memory/Wafer by Algorithm | 118.68 M-Bits |
| 32. Probability for Overall Circuit to be Functional | 92.7 percent |
| 33. Overall Circuit Size: Transistors per Wafer | 767,056,728 |

In summary, this method provides for high electrical functional yield through the use of circuitry conforming to this new architecture as well as the use of a self-test and configuration algorithm enabling the overall circuit to disable the defective portions of itself while surviving with a useful function. This is true in this example where the useful circuit is to be a microelectronic computer system where the exact size of the working memory is not important as long as it is greater than some minimum amount. This minimum memory requirement is determined by availability of competitive systems and software on the market, which currently incorporate about 1 mega-byte of memory, which is about 8.4 million bits, or about 6.9% of that produced by the 125 mm wafer in this example.

It is also possible to apply the principles of this method to circuits which are fabricated on wafers of other sizes. FIGS. 15 through 18 respectively illustrate the overall circuit yield, average memory capacity, the memory block size required, and the ratios for increase in memory bits which yield by this invention on each wafer, from 75 mm to 200 mm in diameter. These results follow from using the same wafer fabrication process technology and the same physical sub-circuit layouts for each of the processors, memories, and I/O ports as were identified in the example above.

Figure 15:
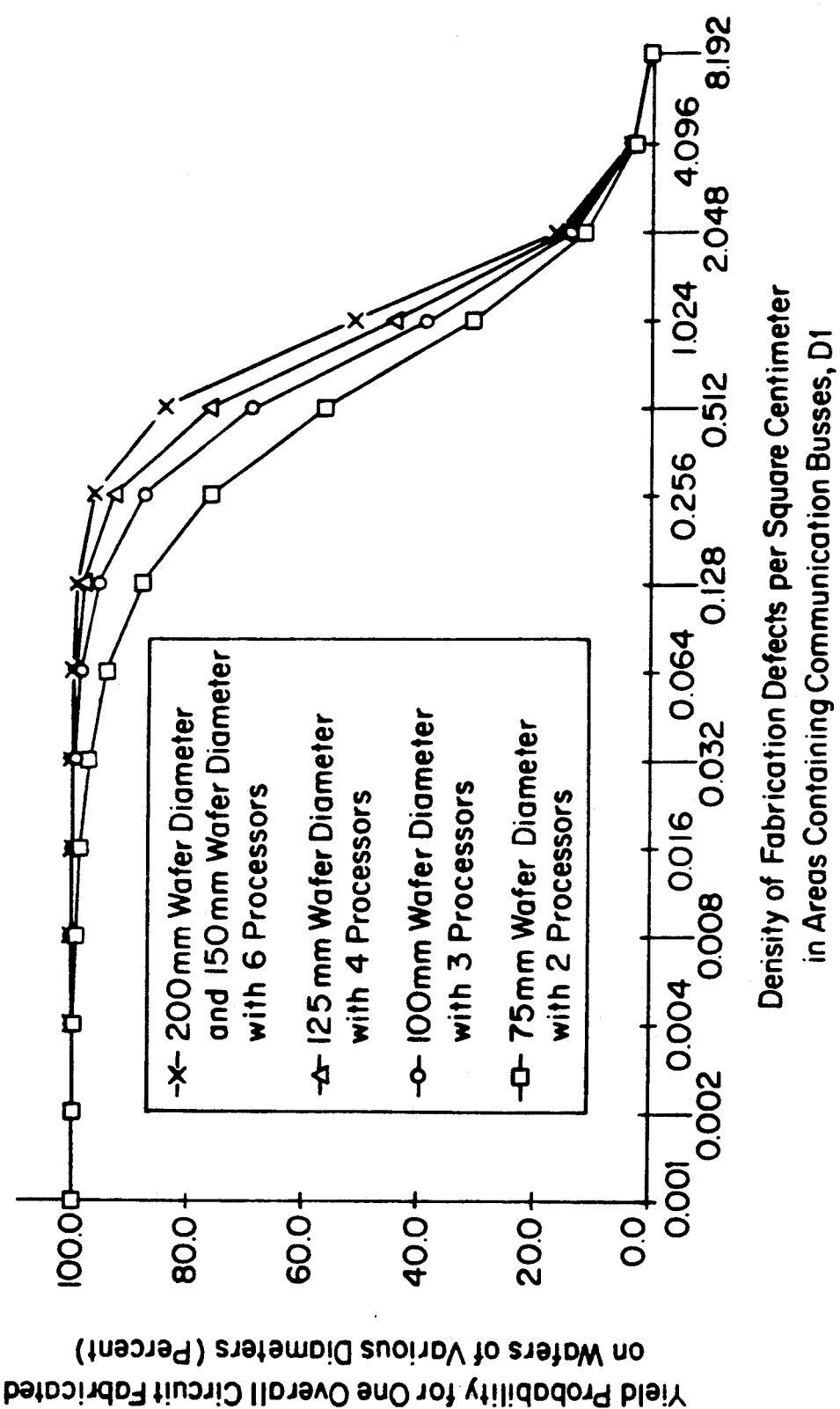
FIG. 15 is a plot of predicted wafer yield versus wafer defect density for various quantities of processors included on wafers of various sizes fabricated in accordance with the invention.
Figure 16:
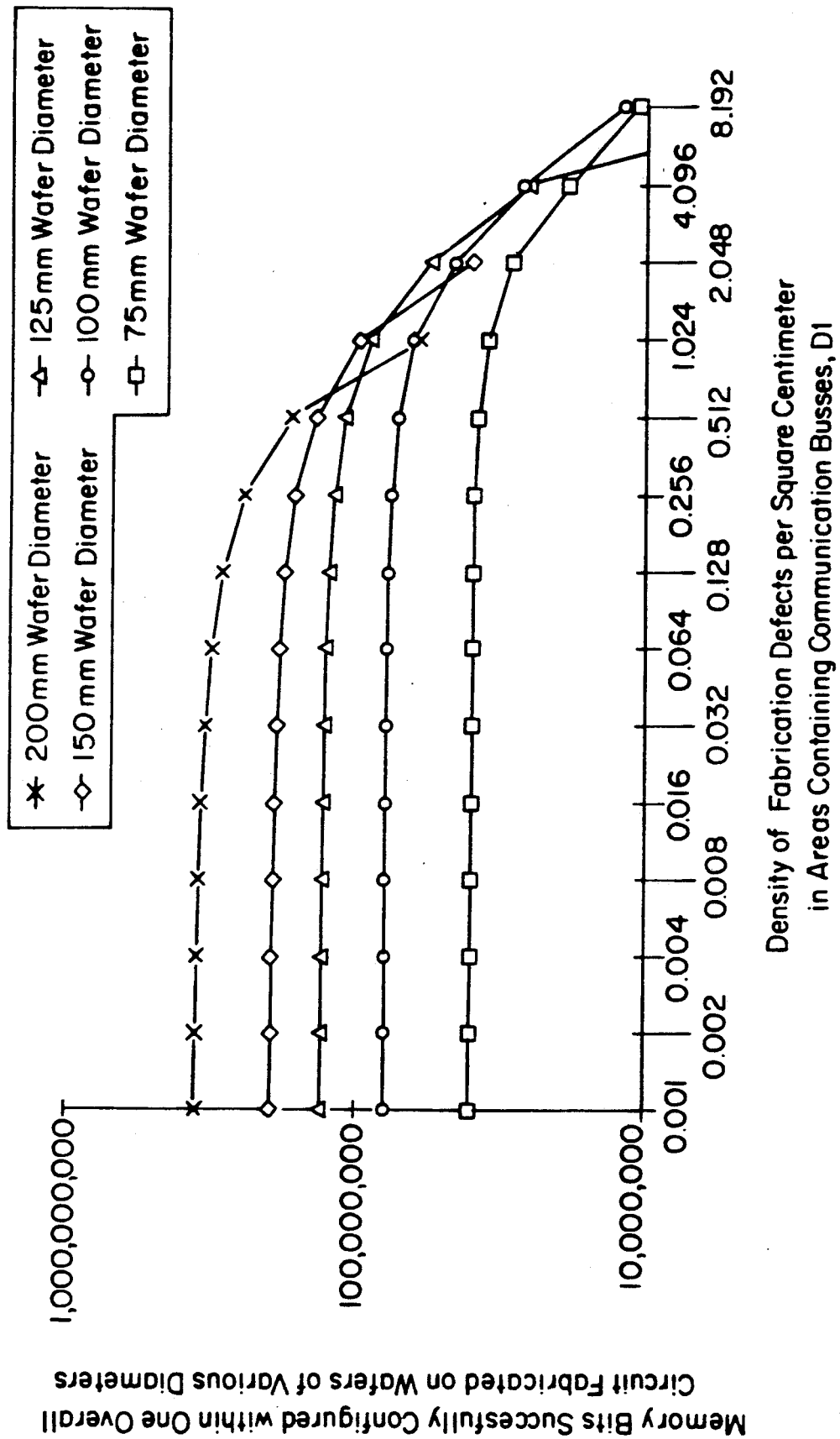
FIG. 16 is a plot of average functional overall circuit memory size versus wafer defect density for various size wafers in accordance with the invention.

FIG. 15 is a plot of the predicted wafer yields and the number of processors included in each overall circuit, according to alternative implementations of this invention. Note that for the smaller wafer diameters, fewer processors are included in these cases due to the optimization of each wafer layout to permit each processor to have a maximum utilization of the available memory fabricated on each wafer. Note that these yields are plotted as a function of one of the defect density parameters, D1. However, each of the defect density parameters D1 through D3 were adjusted in a correlated manner in each calculation using the following ratios between these parameters as determined from measurements of these parameters taken from prior wafer test structures for this invention:

$$D2 = (D1 \times 4.0), \text{ and } D3 = (D1 \times 12.0)/(\text{square root of } (D1/0.256)),$$

where:
D1 = Defect Density for Pathways in Communication Busses
D2 = Defect Density for Lithography of Pathways in Sub-circuits
D3 = Defect Density for Lithography and Crystal Formation of Transistors and other P-N Structures Diffused or Implanted in the Surface of the Wafer FIG. 16 is a plot of the memory capacities which are achievable on each wafer, ranging from 35 to 290 million bits (at D1 = 0.256 defects/cm2) for wafer diameters from 75 mm to 200 mm, respectively. Note that the larger the wafer diameter, the greater the dependence of the configured (e.g., made functional) memory to the defect densities D1 through D3. This increasing dependence follows from the fact that on larger wafers, there exists a larger average number of segmented communication busses through which the overall circuit must operate. It becomes clear that implementing this new method on very large wafers which have a density of defects above approximately 1.0/cm2 does not provide for significantly larger memory configurations when compared to that available on the smaller wafer sizes.

Figure 17:
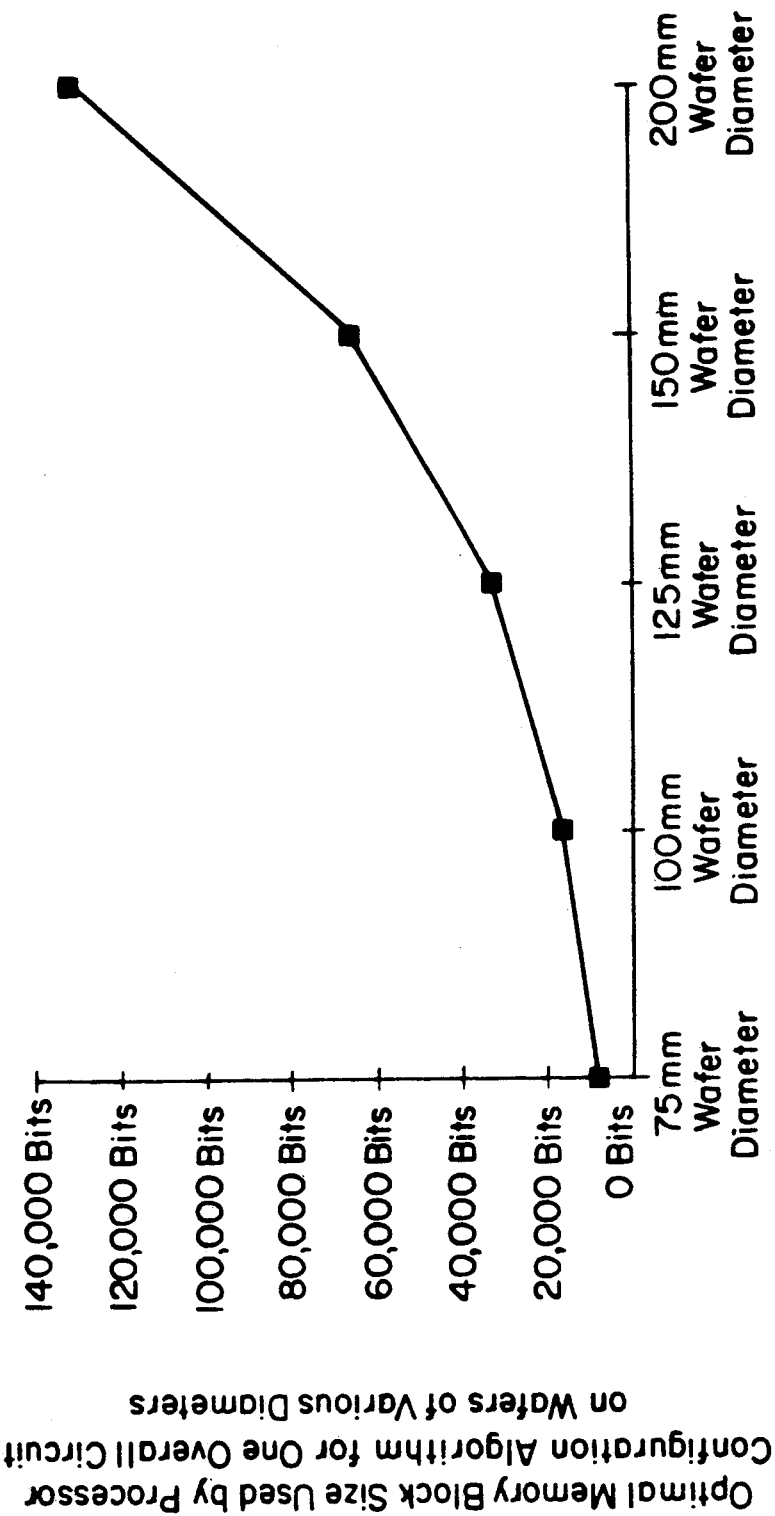
FIG. 17 is a plot of optimal memory block size versus wafer defect density for various size wafers in accordance with the invention.

FIG. 17 is a plot of the optimal memory block sizes to be programmed into the processor start-up algorithm for testing memory sub-circuits. A "block" is a sub-set of memory, set by the control processor test algorithm, which is established to provide for the maximum resolution in determination of defective memory bits, while also providing for the minimum amount of processor RAM as required to record the addresses of defective memory bits. Note that the most desirable block size becomes one memory bit if it were possible to produce enough RAM inside the processor, without greatly reducing its yield statistics, so as to store every memory bit address that could be non-functional. This is not done in this case as the processor RAM would then equal the entire memory available on the rest of the wafer, resulting in a very low-yielding processor implementation. Other methods are contemplated for using smaller block sizes requiring the same or less RAM as given in this example, in which only the defective addresses are stored within the processor. However, these implementations require the use of complex sequential decision logic in the design of the processor which adds wait-states to read/write operations to/from memory, resulting in a reduced computational speed for the system.

The physical layout of each memory sub-circuit incorporates sizing of each memory block to be as small in peripheral size as possible (that is, to be as square as possible rather than to be long and narrow, as is the case with most conventional memory physical layouts) in order to minimize the average number of blocks that will be impacted by each fabrication defect. Therefore, The block sizes given in FIG. 17 are the result of choosing the smallest number of bits per block (so that a minimum amount of each memory sub-circuit is disabled by the presence of each defect) which also results in maximum utilization of the available RAM in the processor.

The control processor start-up algorithm of FIG. 9 has been optimized to perform a two-dimensional search for defective memory blocks on the wafer. This search is governed by the variables listed in Table III below, which lists the maximum values for each variable.

TABLE III

Summary of Software Parameters for Control Processor Start-Up Algorithm

| | |
|---|---|
| 34. Maximum Value of "Quadrant" Variable | 4 |
| 35. Maximum Value of "Y", Set by "Ymax" Variable | 18 |
| 36. Maximum Value of "T" Variable | 1 |
| 37. Maximum Value of "B", Set by "Bmax" Variable | 3,984 |

Note that in all implementations of the preferred embodiment, the "Quadrant" variable will be incremented from 1 to 4 as the control processor searches for defects in quarter sections the wafer; the "Ymax" variable is set to be equal to the highest integer number of sub-circuits which separate the control processor location from the farthest edge of the wafer in either the X or Y direction, this variable is used to limit the time required by the algorithm to find all of the defects that can be located on the wafer, and this variable is proportional to the wafer diameter; the "T" variable controls the directions of the wafer search in each quadrant and enables the control processor to "reach around" defective sub-circuits or communication busses and configure functional sub-circuits which are "behind" these defective sites; and the value of "Bmax" is set to be equal to the number of memory blocks used by the algorithm and is proportional to the square of the wafer diameter.

Figure 18:
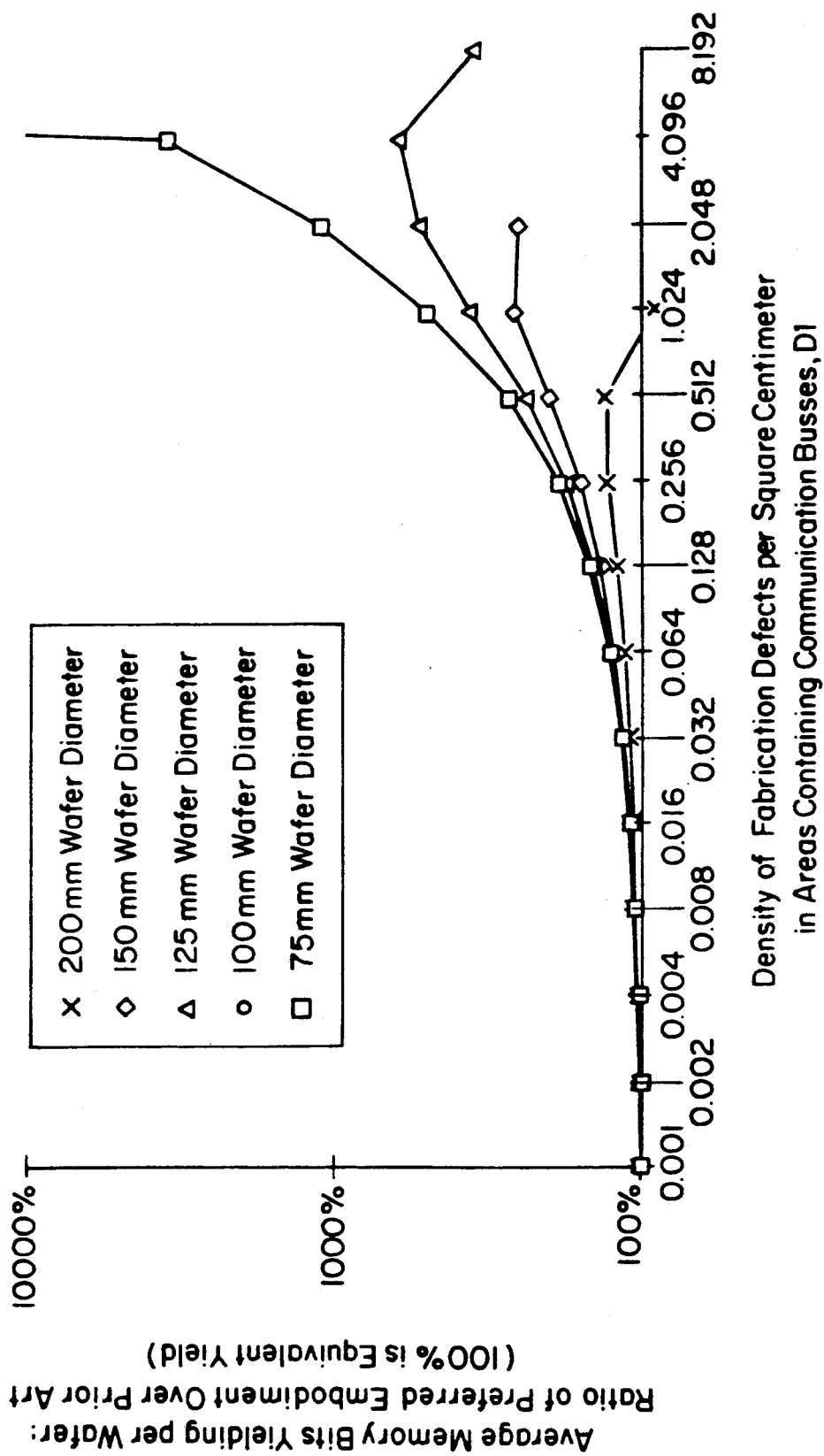
FIG. 18 is a plot of the ratio of improvement in yield over the prior art, made possible by this invention, in the fabrication of total electronic memory on wafers of various sizes in accordance with the invention.

FIG. 18 illustrates the ratio of increase regarding the number of bits of memory which are fabricated to yield as functional circuits, whether this memory is within one overall circuit by this invention, or as single memory components by the prior art. In this figure, only ratios greater than one (percentages greater than 100%) are plotted for various wafer diameters. In addition the same physical layout and format is used for each of the sub-circuits which comprise one overall circuit that occupies most of the available area of each wafer. When the density of defects is very low (the left side of the graph), the benefits of this invention are minimized as this ratio of increase in memory yield is slightly greater than 100%. As the density of defects increases in each case, this ratio rises to a higher value at which this ratio reaches a maximum, then falls to zero for very high values of defect density at the right side of this graph. This result follows from the fact that the improvements in yield over the prior art (in this case, memory sub-circuits which are configured by the processor) will increase due to the aforementioned merits of the invention as defect densities increase, until such a point where a large number of communication busses (not used by prior art methods) also do not function, thereby limiting the processor's ability to find defective memory sub-circuits and thereby greatly reduces the memory yield when compared to the prior art. However, this is not a problem with any of the embodiments of this invention as long as the physical area of the communication busses are much less than the area required by the memories, and the defect densities in the memory areas are higher than those for the communication buss areas. If these conditions are satisfied, then the loss in yield of the memory areas in this invention or the prior art dominates over the additional loss of yield caused by the communication busses, only implemented in this invention. When this invention produces improvements over the prior art which are less than 100%, then it will also be true that so little memory yields in either case to not be a practical consideration. This result is consistent with the regions of the FIG. 18 graph where yield improvements are reducing on the right side of the graph; the defect densities required are between 3 and 40 times (depending on wafer diameter) higher than are measured with present-day, prior art wafer fabrication processes. Therefore, this invention will always provide for an improvement in yield greater than 100% as long as similar defect densities can be achieved in its wafer fabrication as is the case with the prior art. Note that, in this example, an identical CMOS wafer process technology is employed as is used with prior art static random access memory fabrication, with the only difference being the use of multiple reticle sets stepped on each wafer (shown not to increase defect densities in yield test wafers evaluated to date).

If wafer defect densities exceed a value of D1 = 1.024 defects/cm2, where D2 = 4.096 defects/cm2 and D3 = 6.144 defects/cm2, then the number of memory bits which yield in the prior art from a 125 mm wafer becomes less than 25.5 M-bits of the 130.55 M-bits fabricated. In practice, however, the prior art produces between 40 and 80 mega-bits (as SRAM components) per 125 mm wafer, to be price competitive at the present time. The defect densities used for the computation of the values listed in Tables I and II above (D1 = 0.256, D2 = 1.024 and D3 = 3.072 defect/cm2) for the example of this invention are less than the above values; these are representative of the industry and confirmed by yield test wafers evaluated to date. With these representative values, a 125 mm diameter wafer is modelled to produce an average of 68.9 M-bits by the prior art, while this invention produces 118.6 M-bits, a 172% ratio over the prior art. At D1 = 2.048 defects/cm2, where D2 = 8.192 defects/cm2 and D3 = 8.689 defects/cm2, only 11.3 M-bits are modelled to become functional (as individual components) by the prior art, while 55.4 M-bits yield according to this invention, or a 491% ratio of improvement over the prior art. In this last case, this invention is capable of producing memory which is at the threshold of being price competitive with the prior art with defect densities which are substantially higher than any commercial process advertised to be in use by the commercial memory chip producers at the present time. Note that this last case, plotted at D1 = 2.048 and for 125 mm diameter wafer in FIG. 18, is to the left of the value of D1 required to cause less than 100% improvement, which occurs at approximately D1 = 9.05 (not plotted on the graph).

Segmented communication busses are employed in this invention to provide for two primary improvements: overall circuit yield enhancement and the reduction of time delays associated with the sending of signals along these busses across the wafer. Tables IV and V below summarize, respectively, the parameters and ratio of improvements possible by the incorporation of segmented communication busses into this example of the preferred embodiment.

Table IV lists the resulting changes in the yield of an overall circuit on a 125 mm diameter wafer as given earlier (see Tables I and II). In this case if all conductive pathways required to interconnect all of the sub-circuits given in this example were made to be electrically contiguous (e.g., were not segmented by the presence of amplifiers 44, and the communication ports 07 and 08 were fabricated not to extend to cross these pathways 09a), then any defect within any pathway can cause complete sub-circuit failure. This is a straight-forward calculation based on using the Seeds model for D1 = 0.256 defects/cm2 and the overall area given in parameter 39 below. This overall, non-segmented buss yield which is calculated is given in 39 below, resulting in a major reduction of the yield of each overall circuit from 92.7% (parameter 32 above) to 4.8% (parameter 40 below). The meaning of this result is equivalent to an average of about 48 wafers out of a 1,000 will function in any useful manner; the action of the control processor on those wafers that do function will have a nearly identical impact regarding the successful configuration of the wafer's memory sub-circuits as described above for the segmented buss case of Tables I and II above. However, this overall circuit yield is so low that it is contemplated to not warrant consideration in the preferred embodiments of this invention.

TABLE IV

Comparison of Segmented vs. Non-Segmented Communication Buss Fabrication Yields According to Invention

| | | |
|---|---|---|
| 38. | Area of All Conductive Pathways within Communication Busses on Wafer, if Not Segmented | 3,419 mm$^2$ |
| 39. | Probability for All Communication Busses to be Functional Simultaneously | 5.2 percent |
| 40. | Reduced Probability for Overall Circuit to be Functional if All Communication Busses Are Not Segmented | 4.8 percent |

Table V below summarizes the various parameters and calculations required to identify the reduction of the maximum delay time, which results from the use of segmented communication busses, when sending signals along the longest paths possible within an overall circuit configured according to the preferred embodiment of the invention. This maximum delay time defines the memory bandwidth for an overall circuit, as this delay time is the primary parameter that determines the upper computational speed of a single-wafer computer system made in accordance with this invention. This conclusion follows from the measurements (derived from test structures) for the delays within each sub-circuit which are at least an order of magnitude less in time than the overall communication buss delay times calculated in either of parameters 50 and 54 below for the segmented buss case and the non-segmented buss case, respectively.

Note that given the characteristics summarized in parameters 41 through 45 below, each conductive pathway 09a has a minimum delay time of 26.1 pico-seconds (ps), primarily determined by the series resistance of the line, its stray capacitance to wafer 01, and the speed of electron-movement in the metal (about 80% of the speed of light in a vacuum). This would be the delay time of each segmented pathway of the preferred embodiment if the amplifier 44 were to have zero output impedance and the capacitive loading of two other amplifiers 44 connected to the other end of the pathway (one output in an "off" state and one other input) was equal to zero. However, the overall signal delay time over each segmented pathway is calculated to be 309.7 pico-seconds with the inclusion of the amplifier parameters 46 and 47 below. Note that the equivalent input impedance of the two amplifiers (parameter 47), one of which functions to receive the signal at the end of the pathway, is collectively about 5.685 ohms at 200 MHz, which is higher than the parasitic capacitance coupling the pathway itself to the wafer, which is equivalent to about 2,000 ohms at 200 MHz. In summary, the overall signal transport delay across the wafer is 8.36 ns. This is calculated by taking the product of each segmented pathway delay (parameter 49) and the maximum number of configured pathways between any processor and the farthest sub-circuit at the edge of the wafer, which is 27.

Should these communication busses be contiguous throughout the wafer (e.g., not-segmented), these calculations are repeated for this case where one contiguous conductive pathway connects each communication buss signal to all sub-circuits. Each pathway is driven by one amplifier output (parameter 46 resistance) and loaded at 2,047 end points by amplifier inputs (each, parameter 47 capacitance). The overall delay time, to 50% of final value, for the sending of a signal across a length equal to 27 sub-circuit edge dimensions along this pathway distributed across the wafer 01, is calculated to be not less than 585 nano-seconds (parameter 54 below). This is a delay time which is 69.97 times longer than the preferred embodiment using segmented pathways, each driven by one buss amplifier.

Note that each buss amplifier, configured for bi-directional operation, has an internal delay time (to 50% of final value) not less than 116 pico-seconds, which is calculated from parameters 46 and 47 below and applies when no conductive pathway is connected between one bi-directional amplifier's output and one other bi-directional amplifier's input. This delay time is also proportional to the output resistance of the amplifier. This internal delay time has been included in the calculations for each pathway delay, as the input and output capacitances of each amplifier is included in the calculation for pathway capacitances, parameters 44 and 51 below.

TABLE V

Comparison of Segmented vs. Non-Segmented Communication Buss Time Delays According to Invention

| | |
|---|---|
| 41. Average Length of Conductive Pathways in Each Segmented Communication Buss | 4,600 μm |
| 42. Width of All Conductive Pathways | 5.0 μm |
| 43. Nominal Thickness of Insulating Dielectric SiO2 Between Conductive Pathways and Substrate or Top Metal | 2.0 μm |
| 44. Nominal Coupling Capacitance: Each Conductive Pathway to Rest of Wafer | 675 ff |
| 45. Series Resistance of Each Conductive Pathway | 46 ohms |
| 46. Output Resistance of Communication Buss Amplifier to Each Conductive Pathway, Including N+ Plug | 600 ohms |
| 47. Capacitance of Two Communication Buss Amplifiers (One Output & One Input) Terminating Each Conductive Pathway | 140 ff |
| 48. Total Intrinsic Delay: Each Conductive Pathway to 50% of Final Value | 26.9 ps |
| 49. Total Pathway Delay: One Amplifier Driving Segmented Conductive Pathway to 50% of Final Value | 309.7 ps |
| 50. Maximum Processor to Other Sub-circuit Signal Delay Time to Edge of Wafer (Delay through 27 Busses) | 8.36 ns |

TABLE V-continued

Comparison of Segmented vs. Non-Segmented Communication Buss Time Delays According to Invention

| | |
|---|---|
| 51. Total Capacitance of Each Conductive Pathway if Communication Busses Are Not Segmented | 691 pf |
| 52. Average Series Resistance of Each Conductive Pathway if Communication Busses Are Not Segmented | 1,241 ohms |
| 53. Total Intrinsic Delay of Each Conductive Pathway if Communication Busses Are Not Segmented | 298 ns |
| 54. Total Pathway Delay: One Amplifier Driving One Non-Segmented Conductive Pathway to 50% of Final Value | 585 ns |
| 55. Ratio of Speed Improvement By Use of Segmented Conductive Pathways Compared to Non-Segmented Case | 69.98 ratio |

CONCLUSION

In conclusion, the invention provides for an increase in probability for large circuits to be micro-electronically functional over those probabilities which result from prior art fabrication methods. The method has been applied to improve the fabrication yield of a very large memory (approximately 115 million bits, with the inclusion of optional I/0 ports and general-purpose processor(s) capable of handling other data processing tasks) which have a probability of functionality greater than 90%. This example demonstrates how an overall circuit, manufactured with a well-known conventional microelectronic process technology, can be re-organized to include, as a minimum, a special processor or plurality of processors which test, record malfunctions, and re-configure a plurality of other redundant sub-circuits whose overall function benefits from fabrication in a wafer format. In this example, this re-organization permits the fabrication of very large memories which are not produced as a single monolithic integrated circuit by any other known prior art. The benefits of implementing this method are lower fabrication costs, higher electronic speed, and higher electronic reliability, especially when these circuits are manufactured to be larger than are those presently being fabricated as single monolithic die in accordance with the prior art.

EQUIVALENTS

Those skilled in the art will recognize, or be able to ascertain, employing no more than routine experimentation, many equivalents to the specific structures, steps, functions and materials described specifically herein, and such equivalents are intended to be encompassed within the scope of the following claims. For example, sub-circuits capable of identical structure, in addition to memory circuits, include oscillators, adders, flip-flops and conventional logic circuits, all of which can be made to benefit by the merits of this invention. While silicon-on-insulator substrates are preferred for the wafers, and semiconductor-on-insulator structure will suffice and single crystal silicon wafers will also suffice, but without some of the advantages attendant to the buried insulator structure achieved by SOI. Silicon-on-sapphire (SOS) structures as well as ordinary bulk-wafer implementations are also contemplated.

I claim:

1. A wafer interconnect system for distribution of power to circuits or devices fabricated on said wafer and for interconnecting said circuits comprising:

a) a wafer substrate;

b) an active device layer formed on said substrate upon which regions of devices are formed;

c) a first patterned insulator layer formed over said device layer;

d) a first patterned conductive layer formed over said first insulator layer with a first set of contacts extending between said first conductive layer and device layer for interconnecting devices in said active device layer via said first conductive layer;

e) a second patterned insulator layer formed over said first conductor layer;

f) a second patterned conductive layer formed over said second insulator layer with a second set of contacts extending between said second conductive layer and device layer for interconnecting devices in said active device layer via said second conductive layer;

g) a third patterned insulator layer formed over said second conductive layer;

h) a third substantially unpatterned conductive layer formed over said third insulator layer for applying a common voltage to a plurality of a third set of contacts coupled to said device layer;

i) a protective layer formed over said third conductive layer; and j) an insulator formed between said active device layer and said substrate and resistance regions formed in said active device layer and extending through said insulator on one side and to one or more of said contacts on another side and wherein one or more of the resistance regions is contiguous with the substrate and the substrate is doped to be highly conductive for coupling power to the contiguous resistance regions.

2. The system of claim 1 wherein the resistance of said regions is low enough to provide current flow to operate the devices in the active device layer to which the resistance regions are connected, yet high enough to not impair operation of portions of the wafer interconnect system other than where the devices are located should the resistance region become connected to such other portions.

3. The system of claim 2 wherein the bulk resistivity of the substrate is between about 0.005 Ohm-centimeter and 0.1 Ohm-centimeter.

4. The system of claim 1 wherein the conductive layers are formed of metals taken from the group consisting of aluminum, copper and gold.

5. The system of claim 1 wherein the conductive layers are formed of doped polysilicon.

* * * * *